(12) United States Patent
Muramatsu et al.

(10) Patent No.: US 7,538,709 B2
(45) Date of Patent: May 26, 2009

(54) ANALOG-TO-DIGITAL CONVERSION METHOD, ANALOG-TO-DIGITAL CONVERTER, SEMICONDUCTOR DEVICE FOR DETECTING DISTRIBUTION OF PHYSICAL QUANTITY, AND ELECTRONIC APPARATUS

(75) Inventors: Yoshinori Muramatsu, Kanagawa (JP); Noriyuki Fukushima, Kanagawa (JP); Yoshikazu Nitta, Tokyo (JP); Yukihiro Yasui, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/462,429

(22) Filed: Aug. 4, 2006

(65) Prior Publication Data

US 2008/0231491 A1 Sep. 25, 2008

Related U.S. Application Data

(63) Continuation of application No. 11/268,428, filed on Nov. 7, 2005, now Pat. No. 7,315,273.

(30) Foreign Application Priority Data

Nov. 8, 2004 (JP) .............................. P2004-323432

(51) Int. Cl.
 *H03M 1/38* (2006.01)
(52) U.S. Cl. ..................................... 341/161; 250/208.1
(58) Field of Classification Search .......... 341/150–170
 See application file for complete search history.

(56) References Cited

U.S. PATENT DOCUMENTS

| | | | |
|---|---|---|---|
| 5,877,715 | A | 3/1999 | Gowda et al. |
| 6,278,539 | B1 * | 8/2001 | Ooi et al. ................... 359/237 |
| 6,727,486 | B2 * | 4/2004 | Choi ....................... 250/208.1 |
| 6,788,237 | B1 | 9/2004 | Bidermann |

(Continued)

FOREIGN PATENT DOCUMENTS

EP A-1 566 891 A 8/2005

(Continued)

OTHER PUBLICATIONS

Communication dated Jul. 2, 2007 for European Application No. 05 024 229.6-2006.

*Primary Examiner*—Lam T Mai
(74) *Attorney, Agent, or Firm*—Sonnenschein Nath & Rosenthal LLP

(57) ABSTRACT

In an analog-to-digital conversion method for converting a difference signal component representing a difference between a reference component and a signal component in an analog signal to be processed into digital data, in a first process, a signal corresponding to one of the reference component and the signal component is compared with a reference signal for conversion into the digital data. Concurrently with the comparison, counting is performed in one of a down-count mode and an up-count mode, and a count value at a time of completion of the comparison is held. In a second process, a signal corresponding to the other one of the reference component and the signal component is compared with the reference signal. Concurrently with the comparison, counting is performed in the other one of the down-count mode and the up-count mode, and a count value at a time of completion of the comparison is held.

8 Claims, 10 Drawing Sheets

U.S. PATENT DOCUMENTS 6,831,580 B2 * 12/2004 Bae .............................. 341/144
7,088,279 B2 * 8/2006 Muramatsu et al. ......... 341/155
7,129,883 B2 * 10/2006 Muramatsu et al. ......... 341/164
7,375,672 B2 * 5/2008 Muramatsu et al. ......... 341/164

FOREIGN PATENT DOCUMENTS

EP    A-1 592 134 A    11/2005

* cited by examiner

ANALOG-TO-DIGITAL CONVERSION METHOD, ANALOG-TO-DIGITAL CONVERTER, SEMICONDUCTOR DEVICE FOR DETECTING DISTRIBUTION OF PHYSICAL QUANTITY, AND ELECTRONIC APPARATUS

CROSS REFERENCES TO RELATED APPLICATIONS

The application is a continuation application of the U.S. patent application Ser. No. 11/268,428, filed in the United States Patent and Trademark Office on Nov. 7, 2005, the entire contents of which are incorporated herein by reference to the extent permissible by law. This application claims the benefit priority of Japanese Priority document JP 2004-323432, filed in the Japanese Patent Office on Nov. 8, 2004, the entire contents of which are incorporated herein by reference to the extent permissible by law.

BACKGROUND OF THE INVENTION

1. Field of the Invention

The present invention relates to an analog-to-digital (A/D) conversion method, and an A/D converter, a semiconductor device having a plurality of unit elements for detecting distribution of a physical quantity, and an electronic apparatus. More specifically, the present invention relates to a technique for converting analog output electrical signals into digital data, which is suitably used in electronic apparatuses, e.g., a semiconductor device for detecting distribution of a physical quantity, such as a solid-state imaging device, including an array of a plurality of unit elements that are sensitive to electromagnetic radiation input from the outside, such as light or rays, in which the distribution of the physical quantity that is converted into electrical signals by the unit elements is selectively read as electrical signals by address control.

2. Description of the Related Art

Semiconductor devices for detecting distribution of physical quantities are widely used in a variety of fields. In such semiconductor devices, a plurality of unit elements (such as pixels) that are sensitive to electromagnetic radiation input from the outside, such as light or rays, are arranged in a linear or matrix array.

For example, in the field of video apparatuses, charge-coupled-device (CCD), metal-oxide-semiconductor (MOS), or complementary-metal-oxide-semiconductor (CMOS) solid-state imaging devices for detecting a physical quantity, e.g., light (an example of electromagnetic radiation), are used. The distribution of the physical quantity that is converted into electrical signals by unit elements (or pixels in a solid-state imaging device) are read as the electrical signals.

One type of solid-state imaging device is an amplifier-type solid-state imaging device including pixels with active pixel sensor (APS) (also referred to as gain cell) architecture. In the APS architecture, a pixel signal generator that generates a pixel signal corresponding to a signal charge generated by a charge generator includes a driving transistor for amplification. Many CMOS solid-state imaging devices are of the type described above.

In such an amplifier-type solid-state imaging device, in order to read pixel signals to the outside, address control is performed on a pixel unit having an array of unit pixels to selectively read signals from the individual unit pixels. An amplifier-type solid-state imaging device is therefore one example of address-controlled solid-state imaging device.

For example, in an amplifier-type solid-state imaging device as one type of XY-addressed solid-state imaging device including a matrix of unit pixels, each pixel is configured using an active element of the MOS structure (MOS transistor) or the like so that the pixel itself can have the amplification capability. Signal charges (photoelectrons) accumulated in a photodiode acting as a photoelectric conversion element are amplified by the active element, and the amplified signals are read as image information.

In this type of XY-addressed solid-state imaging device, for example, a large number of pixel transistors are arranged in a two-dimensional matrix to form a pixel unit. Accumulation of signal charges corresponding to incident light is started on a line-by-line (row-by-row) or pixel-by-pixel basis. Current or voltage signals based on the accumulated signal charges are sequentially read from the pixels by addressing. In the MOS (including CMOS) type, an exemplary address control method for simultaneously accessing pixels on one row to read pixel signals from the pixel unit on a row-by-row basis is often used.

The analog pixel signals read from the pixel unit are converted into digital data, as necessary, by an analog-to-digital (A/D) converter. Since the pixel signals are output in the form in which a signal component is added to a reset component, it is necessary to take the difference between a signal voltage corresponding to the reset component and a signal voltage corresponding to the signal component to extract a true effective signal component.

This also applies to a case where the analog pixel signals are converted into digital data. In this case, a difference signal component representing the difference between the signal voltage corresponding to the reset component and the signal voltage corresponding to the signal component is finally converted into digital data. Accordingly, a variety of arrangements for A/D conversion have been proposed in Japanese Unexamined Patent Application Publication No. 11-331883 and the following documents:

W. Yang et. al., "An Integrated 800.times.600 CMOS Image System", ISSCC Digest of Technical Papers, pp. 304-305, February, 1999 (hereinafter referred to as a first non-patent document)

Kazuya Yonemoto, "CCD/CMOS Image Sensor no Kiso to Oyo (fundamentals and applications of CCD/CMOS image sensors)", CQ Publishing Co., Ltd., first edition, pp. 201-203, Aug. 10, 2003 (hereinafter referred to as a second non-patent document)

Toshifumi Imamura and Yoshiko Yamamoto, "3. Kosoku/kinou CMOS Image Sensor no Kenkyu (study on high-speed-and-performance CMOS image sensors)", (which is available on-line via the Internet from <URL: http://www.sankaken.gr.jp/project/iwataPJ/report/h12/h12index.html>) (accessed Mar. 15, 2004) (hereinafter referred to as a third non-patent document)

Toshifumi Imamura, Yoshiko Yamamoto, and Naoya Hasegawa, "3. Kosoku/kinou CMOS Image Sensor no Kenkyu (study on high-speed-and-performance CMOS image sensors)", (which is available on-line via the Internet from <URL: http://www.sankaken.gr.jp/project/iwataPJ/report/h14/h14index.html>) (accessed Mar. 15, 2004) (hereinafter referred to as a fourth non-patent document)

Imamura et. al., "3. Kosoku/kinou CMOS Image Sensor no Kenkyu (study on high-speed-and-performance CMOS image sensors)", (which is available on-line via the Internet from <URL: http://www.sankaken.gr.jp/project/iwataPJ/report/h14/h14index.html>) (accessed Oct. 15, 2004) (hereinafter referred to as a fifth non-patent document)

Oh-Bong Kwon et. al., "A Novel Double Slope Analog-to-Digital Converter for a High-Quality 640.times.480 CMOS Imaging System", VL3-03, IEEE, pp. 335-338, 1999 (hereinafter referred to as a sixth non-patent document)

However, the A/D conversion arrangements of the related art disclosed in the above-listed documents have difficulty in terms of the circuit size, the circuit area, the power consumption, the number of lines for interfacing with other functional units, noise and current consumption due to the lines, etc.

FIG. 9 is a schematic configuration diagram of a CMOS solid-state imaging device (CMOS image sensor) of the related art in which an A/D converter and a pixel unit are mounted on the same semiconductor substrate. As shown in FIG. 9, a solid-state imaging device 1 includes a pixel unit (imaging unit) 10 having a plurality of unit pixels 3 arranged in rows and columns, a driving controller 7 provided outside the pixel unit 10, a counter (CNT) 24, a column processor 26 including column A/D circuits 25 provided for the respective columns, a reference signal generator 27 including a digital-to-analog converter (DAC) that supplies a reference voltage for A/D conversion to the column A/D circuits 25 in the column processor 26, and an output circuit 28 including a subtractor circuit 29.

The driving controller 7 includes a horizontal scanning circuit (column scanning circuit) 12 that controls column addressing or column scanning, a vertical scanning circuit (row scanning circuit) 14 that controls row addressing or row scanning, and a timing controller 21 that generates various internal clocks in response to a master clock CLK0 via a terminal 5a to control the horizontal scanning circuit 12, the vertical scanning circuit 14, and the like.

The unit pixels 3 are connected to row control lines 15 that are controlled by the vertical scanning circuit 14 and to vertical signal lines 19 that transfer pixel signals to the column processor 26.

Each of the column A/D circuits 25 includes a voltage comparator 252 and a data storage unit 255, and has a function of an n-bit A/D converter. The voltage comparator 252 compares a reference voltage RAMP generated by the reference signal generator 27 with analog pixel signals obtained for row control lines 15 (V0, V1, . . . ) from the unit pixels 3 via the vertical signal lines 19 (H0, H1, . . . ) The data storage unit 255 includes a latch (flip-flop) acting as a memory that stores a count value of the counter 24 that counts the time required by the voltage comparator 252 to finish its comparison operation. The data storage unit 255 includes n-bit latches 1 and 2 serving as internal independent storage areas.

The ramp reference voltage RAMP generated by the reference signal generator 27 is commonly fed to input terminals RAMP of the voltage comparators 252, and individual pixel signal voltages from the pixel unit 10 are fed to the other input terminals of the voltage comparators 252 that are connected to the vertical signal lines 19 of the associated columns. The signals output from the voltage comparators 252 are supplied to the data storage units 255.

The counter 24 performs counting in accordance with a count clock CK0 corresponding to the master clock CLK0 (for example, both clocks have the same clock frequency), and supplies count outputs CK1, CK2, . . . , CKn, together with the count clock CK0, commonly to the column A/D circuits 25 of the column processor 26.

Lines for the count outputs CK1, CK2, . . . , CKn from the counter 24 are routed to the latches of the data storage units 255 provided for the respective columns so that the single counter 24 can be shared by the column A/D circuits 25 for the respective columns.

The outputs of the column A/D circuits 25 are connected to horizontal signal lines 18. The horizontal signal lines 18 include signal lines for 2n bits, and are connected to the subtractor circuit 29 of the output circuit 28 via 2n sensing circuits (not shown) associated with the respective output lines. Video data D1 output from the output circuit 28 is output to the outside from the solid-state imaging device 1 via an output terminal 5c.

FIG. 10 is a timing chart for illustrating an operation of the solid-state imaging device 1 of the related art shown in FIG. 9.

For example, for the first reading operation, the count value of the counter 24 is first reset to an initial value of 0. Then, after the first reading operation of reading pixel signals from the unit pixels 3 on an arbitrary row Hx to the vertical signal lines 19 (H0, H1, . . . ) becomes stable, the reference voltage RAMP generated by the reference signal generator 27 so as to change stepwise over time to form a substantially sawtooth (or ramp) waveform is input. The voltage comparator 252 compares the reference voltage RAMP with a pixel signal voltage on an arbitrary vertical signal line 19 (with a column number Vx).

In synchronization with the ramp-waveform voltage output from the reference signal generator 27 (at time t10), the counter 24 starts down-counting from the initial value of 0 in the first counting operation in order to measure a comparison time of the voltage comparator 252 using the counter 24 in response to the reference voltage RAMP input to the input terminal RAMP of the voltage comparator 252.

The voltage comparator 252 compares the ramped reference voltage RAMP from the reference signal generator 27 with the pixel signal voltage Vx input via the vertical signal line 19. When both voltages become equal, the voltage comparator 252 inverts its output from a high level to a low level (at time t12).

Substantially at the same time as the inversion of the output of the voltage comparator 252, the data storage unit 255 latches (holds or stores) the count outputs CK1, CK2, . . . , CKn from the counter 24 depending on the comparison period of time in the latch 1 of the data storage unit 255 in synchronization with the count clock CK0. The first iteration of A/D conversion is thus completed (at time t12).

When a predetermined down-count period elapses (at time t14), the timing controller 21 stops the supply of control data to the voltage comparator 252 and the supply of the count clock CK0 to the counter 24. The voltage comparator 252 thus stops generating the ramped reference voltage RAMP.

In the first reading operation, a reset component ΔV of each of the unit pixels 3 is read. The reset component ΔV includes noise that varies depending on the unit pixel 3 as an offset. The variations in the reset component ΔV are generally small, and the reset levels are common to all pixels. Thus, the output of an arbitrary vertical signal line 19 (Vx) is substantially known.

Thus, in the first reading operation of reading the reset component ΔV, the reference voltage RAMP is adjusted to reduce the comparison period. In this arrangement of the related art, comparison is performed on the reset component ΔV for a count period of 7 bits (128 clock cycles).

In the second reading operation, a signal component Vsig corresponding to the amount of light incident on each of the unit pixels 3 is read in addition to the reset component ΔV, and a similar operation to that of the first reading operation is performed.

More specifically, for the second reading operation, the count value of the counter 254 is first reset to an initial value of 0. Then, after the second reading operation of reading pixel signals from the unit pixels 3 on an arbitrary row Hx to the vertical signal lines 19 (H0, H1, . . . ) becomes stable, the reference voltage RAMP generated by the reference signal generator 27 so as to change stepwise over time to form a substantially ramp waveform is input. The voltage comparator 252 compares the reference voltage RAMP with a pixel signal voltage on an arbitrary vertical signal line 19 (with a column number Vx).

In synchronization with the ramp waveform voltage output from the reference signal generator 27 (at time t20), the counter 24 starts down-counting from the initial value of 0 in the second counting operation in order to measure a comparison time of the voltage comparator 252 using the counter 24 in response to the reference voltage RAMP input to the input terminal RAMP of the voltage comparator 252.

The voltage comparator 252 compares the ramp reference voltage RAMP from the reference signal generator 27 with the pixel signal voltage Vx input via the vertical signal line 19. When both voltages become equal, the voltage comparator 252 inverts its output from a high level to a low level (at time t22).

Substantially at the same time as the inversion of the output of the voltage comparator 252, the data storage unit 255 latches (holds or stores) the count outputs CK1, CK2, . . . , CKn from the counter 24 depending on the comparison period of time in synchronization with the count clock CK0. The second iteration of A/D conversion is thus completed (at time t22).

The data storage unit 255 stores the count value obtained in the first counting operation and the count value obtained in the second counting operation in different places of the data storage unit 255, namely, in the latch 2. In the second reading operation, the combination of the reset component ΔV and the signal component Vsig of each of the unit pixels 3 is read.

When a predetermined down-count period elapses (at time t24), the timing controller 21 stops the supply of control data to the voltage comparator 252 and the supply of the count clock CK0 to the counter 24. The voltage comparator 252 thus stops generating the ramp reference voltage RAMP.

At a predetermined timing (t28) after the second counting operation is completed, the timing controller 21 instructs the horizontal scanning circuit 12 to read pixel data. In response to the instruction, the horizontal scanning circuit 12 sequentially shifts a horizontal selection signal CH(i) to be supplied to the data storage unit 255 via control line 12c.

The count values stored in the data storage unit 255, i.e., n-bit pixel data in the first iteration and n-bit pixel data in the second iteration each represented by digital data of n bits, are sequentially output to the outside of the column processor 26 via n (2n, in total) horizontal signal lines 18 and are input to the subtractor circuit 29 of the output circuit 28.

The n-bit subtractor circuit 29 subtracts, for each pixel position, the pixel data in the first iteration indicating the reset component ΔV of a unit pixel 3 from the pixel data in the second iteration indicating the combination of the reset component ΔV and the signal component Vsig of the unit pixel 3 to determine the signal component Vsig of the unit pixel 3.

A similar operation is repeatedly performed sequentially on a row-by-row basis. Therefore, video signals representing a two-dimensional image are obtained in the output circuit 28.

SUMMARY OF THE INVENTION

In the related art, the single counter 24 is shared by the column A/D circuits 25 provided for the respective columns. The data storage unit 255 serves as a memory that is adapted to store the results of the first and second counting operations.

Thus, two n-bit latches are needed for an n-bit signal (2n latches are needed for each bit), which thus causes an increase in circuit area (hereinafter referred to as a first problem).

Furthermore, lines for feeding the count clock CK0 for synchronization and the count outputs CK1, CK2, . . . , CKn from the counter 24 to the latches 1 and 2 of the data storage units 255 provided for the respective columns are also needed, leading to concern for an increase in noise or power consumption (hereinafter referred to as a second problem).

Furthermore, 2n signal lines are needed for transmitting the results of the first and second counting operations to the data storage unit 255 to store the count values of the first and second counting operations at different locations of the data storage unit 255, which thus causes an increase in current (hereinafter referred to as a third problem).

Furthermore, in order to subtract the count value of the first counting operation from the count value of the second counting operation before the output circuit 28 outputs a signal to the outside, 2n signal lines for transferring the count values to the n-bit subtractor circuit 29 of the output circuit 28 are needed, leading to concern for an increase in noise or power consumption due to data transfer (hereinafter referred to as a fourth problem).

Specifically, a memory for storing the result of the first reading operation and a memory for storing the result of the second reading operation need to be provided (i.e., two memories are needed) separately from the counter. Signal lines for transferring n-bit count values from the counter to the memories are also needed. Moreover, 2n-bit (double) signal lines are needed for n bits in order to transfer the count values of the first and second counting operations to the subtractor. Thus, the circuit size and the circuit area are increased, and an increase in noise, current consumption, or power consumption is also caused.

In a pipeline arrangement that allows A/D conversion and reading to be performed in parallel, a memory for storing A/D converted data is needed separately from a memory for storing a result of counting. Thus, as in the first problem, two memories for storing A/D converted data are needed, which thus causes an increase in circuit area (hereinafter referred to as a fifth problem).

As discussed above, variations in a reset component ΔV of a unit pixel 3 in the first reading operation are generally small. However, as the gain increases, the variations are multiplied pro rata by the gain, and the reset component ΔV can be out of a comparable range if the comparison period is reduced. Thus, it can be difficult to perform comparison (hereinafter referred to as a sixth embodiment).

In other words, it is necessary to set the comparison period while taking both the magnitude and variations in the reset component ΔV into account in order to achieve high-accuracy A/D conversion. In this case, the comparison period is longer.

As a solution to the first problem, for example, the second non-patent document noted above discloses a column A/D converter circuit. The column A/D converter circuit achieves both a correlated double sampling (CDS) function and an A/D conversion function by cascading a counter commonly used for columns with a CDS processing unit and a latch for storing the count value of the counter for each column.

As a solution to the second problem, for example, an arrangement in which the column processor 26 includes a counter for each column, thereby achieving an A/D conversion function has been proposed (see, for example, Japanese Unexamined Patent Application Publication No. 11-331883 and the third to sixth non-patent documents noted above).

The column A/D converter circuit disclosed in the second non-patent document includes counters and A/D converters including latches, which perform parallel processing for each vertical signal line (column). The column A/D converter circuit converts analog signals into digital signals by taking the difference between a reset component and a signal component while suppressing pixel-to-pixel fixed pattern noise. Thus, no subtraction is needed, and only a single counting operation is needed. Moreover, memories for storing A/D converted data can be implemented by the latches, thereby preventing an increase in circuit area. Therefore, the first, third, fourth, and fifth problems are overcome.

However, as in the arrangement shown in FIG. 9, the counter is commonly used for all columns, and n lines for feeding the count outputs CK1, CK2, . . . , CKn from the counter to the latches of the data storage units 255 provided for the respective columns are still needed. Therefore, the second problem is not overcome.

In the techniques disclosed in the third and fourth non-patent documents noted above, currents from a plurality of pixels that detect light are simultaneously output to an output bus, and addition and subtraction are performed in terms of currents on the output bus. The resulting signals are converted into pulse-width signals having magnitudes in the time domain. The clock cycles of the pulse widths of the pulse-width signals are counted by column-parallel counter circuits. Thus, A/D conversion is performed. This arrangement eliminates wiring for count outputs. That is, the second problem is overcome.

However, there is no mention of handling of a reset component or a signal component. Thus, the first, third, fourth, and fifth problems are not necessarily overcome. The first and sixth non-patent documents noted above do not mention handling of a reset component or a signal component, either.

Japanese Unexamined Patent Application Publication No. 11-331883 noted above mentions handling of a reset component and a signal component. In order to extract voltage data of a pure image from a reset component and a signal component by means of, e.g., correlated double sampling, digital data of the reset component is subtracted from digital data of the signal component for each column. Therefore, the fourth problem is overcome.

In the techniques disclosed in this publication, however, counting is performed in an external system interface to generate a count signal. A set of buffers provided for each column stores a count value at a time when a voltage of the reset component or the signal component matches a reference voltage for comparison. The arrangement for A/D conversion is similar to that disclosed in the first non-patent document noted above in that a single counter is commonly used for columns. Therefore, the first to third and fifth problems are not overcome.

With respect to the sixth problem, the voltage comparator 252 of the related art shown in FIG. 9 is referred to although the circuit structure thereof is not clearly illustrated. In FIG. 9, it is assumed that, for example, a known differential amplifier arrangement disclosed in the fifth non-patent document noted above (see the comparator shown in FIG. 8) is used.

A first input terminal of a differential pair of the voltage comparator 252 is connected to a column line Vx and a second input terminal of the differential pair is connected to the reference signal generator 27 so that a pixel signal Vx can be compared with the reference voltage RAMP. The A/D converted output data is stored in the data storage unit 255. In this arrangement, however, as discussed above, if the comparison period in the first reading operation is reduced, it can be difficult to perform comparison because the reset component ΔV is out of a comparable range. Therefore, the sixth problem is not overcome.

It is therefore desirable to provide a new arrangement to overcome at least one of the first to sixth problems.

According to an embodiment of the present invention, there is provided an analog-to-digital conversion method for converting a difference signal component of an analog signal to be processed including a reference component and a signal component into digital data, the difference signal component representing a difference between the reference component and the signal component. The method includes the steps of comparing a signal corresponding to each of the reference component and the signal component with a reference signal for conversion into the digital data, performing counting in one of a down-count mode and an up-count mode concurrently with the comparison, and holding a count value at a time of completion of the comparison. The mode of counting is switched depending on whether the comparison is performed on the reference component or the signal component.

With respect to switching of the mode of counting, in a first process, a signal corresponding to one of a reference component and signal component having different physical properties in a single signal to be processed that is output from the same unit element, such as a pixel, is compared with the reference signal for conversion into the digital data. Concurrently with the comparison, counting is performed in one of the down-count mode and the up-count mode, and a count value at a time of completion of the comparison is held.

In a second process, the other one of the reference component and the signal component is compared with the reference signal. Concurrently with the comparison, counting is performed in the other one of the down-count mode and the up-count mode, and a count value at a time of completion of the comparison is held. The count value held as a result of the second process represents the difference from the count value of the first process. Thus, by performing two counting operations while switching the mode of counting, a digital value corresponding to the difference between the reference component and the signal component is obtained as the count value of the second counting operation.

The signal component to be processed in the second process may be any signal component representing at least a true signal component in the signal to be processed. The signal component does not necessarily refer only to a true signal component, and may actually include a noise component or a reset component included in the signal to be processed.

The reference component and the signal component are relative. That is, the difference signal component between the reference component and the signal component may be any component representing the difference between two signal components having different physical properties in the signal to be processed that is output from the same unit element, such as a pixel.

In a case of performing comparison on the reference component or the signal component, a signal corresponding to the reference component or the signal component may be compared with a reference signal that changes at a predetermined gradient, and a point where the signal corresponding to the reference component or the signal component matches the reference signal may be detected. The predetermined gradient is not limited to a fixed gradient, and may include a plurality of gradients that are set stepwise so that, for example, the larger the signal component, the higher the gradient, thereby achieving a wider dynamic range.

In a case of performing counting, counting may be performed based on a count clock between the time when the reference signal used for the comparison is generated and the time when the signal corresponding to the reference component or the signal component matches the reference signal, thereby determining a count value corresponding to the magnitude of the reference component or the signal component.

In a case of performing counting in the down-count mode or the up-count mode, a common up-down counter may be used, and the processing mode of the up-down counter may be switched. The counter circuit used for counting can therefore become compact. By performing counting while switching between the two modes, the reference component can directly be subtracted from the signal component, and no special subtractor for subtracting the reference component from the signal component is needed.

In the second process, counting may be started from the count value held in the first process. The count value held as a result of the second process is therefore a digital value representing the difference between the reference component and the signal component.

By performing comparison and counting on the reference component in the first process and performing comparison and counting on the signal component in the second process, the count value held as a result of the second process becomes a digital value obtained by subtracting the reference component from the signal component.

In a case where a signal to be processed for a unit element, such as a pixel, is a signal in which a signal component temporally appears after a reference component, the second process is performed on a signal in which the signal component is added to the reference component, and the count value held as a result of the second process represents the signal component of the unit element.

By performing counting on the reference component in the down-count mode and performing counting on the signal component in the up-count mode, the count value held as a result of the two processes is obtained so that a digital value obtained by subtracting the reference component from the signal component is a positive value.

By performing a combination of the first process in which comparison and down-counting are performed on the reference component and the second process in which comparison and up-counting are performed on the signal component, the count value held as a result of the second process is obtained so that a digital value obtained by subtracting the reference component from the signal component is a positive value. In a case where a signal to be processed for a unit element is a signal in which a signal component temporally appears after a reference component, digital data representing an effective signal component of the unit element is obtained as a positive-value data.

The reference component is a substantially fixed component and has a low signal level, while the signal component is a varying component that is obtained by detecting electromagnetic radiation, such as light, using unit elements, such as pixels, and has a large maximum signal level. Instead of setting the same maximum period of comparison, i.e., maximum period of A/D conversion, for the reference component and the signal component, the maximum period of comparison for the reference component may be set shorter than that for the signal component, thereby reducing the total A/D conversion period over the two iterations of A/D conversion.

The reference component has variations. As the gain increases, the variations are also multiplied pro rata by the gain, and the reference component can be out of a comparable range if the comparison period is reduced. Thus, it can be difficult to correctly perform comparison. In order to avoid this drawback, in a case of performing comparison and counting on the reference component, the comparator may first be reset to an operational reference value for reading the reference component, and the reference signal may then be supplied to the comparator to start comparison and counting.

However, resetting the comparator to the operational reference value can lead to concern for kTC noise. Thus, in a case of performing comparison and counting on the signal component, the reference signal may be supplied to the comparator without resetting the comparator to start comparison and counting.

The count value held in the second process for a previous signal to be processed may be stored in a data storage unit. When the first process and the second process are performed for a current signal to be processed, the count value may be read from the data storage unit in parallel.

In the analog-to-digital conversion method described above, the signal to be processed may be an analog unit signal that is generated by a unit-signal generator and that is output in a column direction in a semiconductor device for detecting distribution of a physical quantity, the semiconductor device including a matrix of unit elements, each of the unit elements including a charge generator that generates a charge corresponding to incident electromagnetic radiation and the unit-signal generator that generates a unit signal corresponding to the charge generated by the charge generator.

In the arrangement in which the unit elements are arranged in a two-dimensional matrix, the analog unit signal generated by the unit-signal generator and output in the column direction may be accessed and captured (vertical scanning) on a row-by-row basis (or in column-parallel manner), and the first process and the second process may be performed for each of the unit elements on the row-by-row basis, thereby achieving high-speed reading and analog-to-digital conversion of the unit signals.

According to another embodiment of the present invention, there is provided an analog-to-digital converter that is suitable for performing the analog-to-digital conversion method described above. The analog-to-digital converter includes a comparator that compares a signal corresponding to each of the reference component and the signal component with a reference signal for analog-to-digital conversion, and a counter that performs counting in one of a down-count mode and an up-count mode concurrently with the comparison in the comparator and that holds a count value at a time of completion of the comparison in the comparator.

Preferably, the analog-to-digital converter further includes a reference signal generator that generates the reference signal for conversion into the digital data and that supplies the reference signal to the comparator, and a controller that switches a mode of counting in the counter depending on whether the comparator performs the comparison on the reference component or the signal component.

The counter may include a common counter circuit, and may be capable of switching between the up-count mode and the down-count mode. Alternatively, the counter may include a down-counter circuit that performs counting in the down-count mode and an up-counter circuit that performs counting in the up-count mode. In the latter case, the counter may include an adder circuit that calculates a sum of a count value held in the down-counter circuit and a count value held in the up-counter circuit depending on the circuit structure.

A semiconductor device or an electronic apparatus according to an embodiment the present invention performs the analog-to-digital conversion method described above. The semiconductor device or electronic apparatus includes similar components to those of the analog-to-digital converter described above.

A semiconductor device according to an embodiment of the present invention may include a plurality of analog-todigital converters in a row direction in which columns of unit elements are arranged, each analog-to-digital converter including a comparator and a counter.

The comparator may capture, on a row-by-row basis, analog unit signals that are generated by a unit-signal generator and that are output in a column direction. The comparator and the counter may perform comparison and counting on each of the unit elements on a row-by-row basis. The unit-signal generator may include a semiconductor element for amplification.

A charge generator may include a photoelectric conversion element that generates a charge corresponding to light received as electromagnetic radiation. The semiconductor device can therefore be implemented as a solid-state imaging device.

According to the A/D conversion method, the A/D converter, the semiconductor device, and the electronic apparatus, therefore, a reference signal for A/D conversion is compared with a signal to be processed including a reference component and a signal component. Concurrently with the comparison, counting is performed in one of a down-count mode and an up-count mode. When a count value at a time of completion of the comparison is held, the count mode is switched depending on whether the comparison is performed on the reference component or the signal component.

Thus, digital data representing the difference between the reference component and the signal component can be obtained as a result of counting in the down-count mode and counting in the up-count mode.

Therefore, memories for storing a count value for the reference component and a count value for the signal component can be implemented by the latch function of the counter, and no dedicated memory for storing A/D converted data is needed separately from the counter. This serves to avoid increase in circuit size and circuit area.

Furthermore, the A/D converter includes a comparator and a counter irrespective of whether to use an up-down counter commonly used for up-counting and down-counting. Thus, irrespective of the number of bits, counting can be controlled by a single count clock for operating the counter and a control line for switching the count mode, and signal lines for transferring count values of the counter to memories are not needed. This serves to avoid increase in noise or power consumption.

By commonly using an up-down counter irrespective of the operation mode and performing counting while switching the processing mode of the up-down counter, the reference component can directly be subtracted from the signal component, and no special subtractor for subtracting the reference component from the signal component is needed. Furthermore, there is no need for data transfer to the subtractor, thereby avoiding increase in noise or increase in current or power consumption.

In a case where the counter is implemented by a combination of a down-counter circuit and an up-counter circuit, by setting a count value obtained in the first counting operation as an initial value before starting the second counting operation, the reference component can directly be subtracted from the signal component, and no special adder is needed to calculate the difference between the reference component and the signal component. Furthermore, there is not need for data transfer to a subtractor. This serves to avoid increase in noise, current, or power consumption.

In a case where the counter is implemented by a combination of a down-counter circuit and an up-counter circuit, instead of setting a count value obtained in the first counting operation as an initial value, counting may be started from zero. In this case, an adder circuit for calculating a sum of the count values is needed. Even in this case, the adder circuit is provided for each A/D converter including a comparator and a counter, and the line length can be reduced. This serves to avoid increase in noise, current, or power consumption due to data transfer.

Furthermore, since the A/D converter includes a comparator and a counter, when a single to be processed is a unit signal output from a semiconductor device including a matrix of unit elements, a counter can be provided in each of a plurality of A/D converters that are arranged in a row direction in which columns of the unit elements are arranged. Thus, unlike the arrangement of the related art shown in FIG. 9, lines for count outputs from the counters need not be routed to latches. This serves to avoid increase in noise or increase in power consumption due to routing of the lines.

Furthermore, in a pipeline arrangement that allows A/D conversion and reading to be performed in parallel, only one memory for storing A/D converted data is needed for each A/D converter. This serves to minimally increase in circuit area.

When comparison and counting are performed on a reference component, by starting comparison and counting after resetting the comparator to an operational reference value for reading the reference component, the operating point of the comparator is set at a read potential of the signal, leading to less susceptibility to variations in the reference component. When comparison and counting are performed on a signal component, by starting comparison and counting without resetting the comparator, substantial subtraction can performed by performing the two processes. Therefore, the fixed offset noise, as well as kTC noise, can be removed.

DESCRIPTION OF THE PREFERRED EMBODIMENTS

Embodiments of the present invention will now be described in detail with reference to the drawings in the context of a CMOS imaging device, which is an example of XY-addressed solid-state imaging device. In the following description, all pixels of the CMOS imaging device are constructed of n-channel MOS (NMOS) transistors.

However, this CMOS imaging device is merely an example, and any device other than MOS imaging devices may be used. The following embodiments can be applied to any semiconductor device for detecting distribution of a physical quantity, including a plurality of unit elements sensitive to electromagnetic radiation input from the outside, such as light or rays, arranged in a linear or matrix array.

First Embodiment

Figure 1:
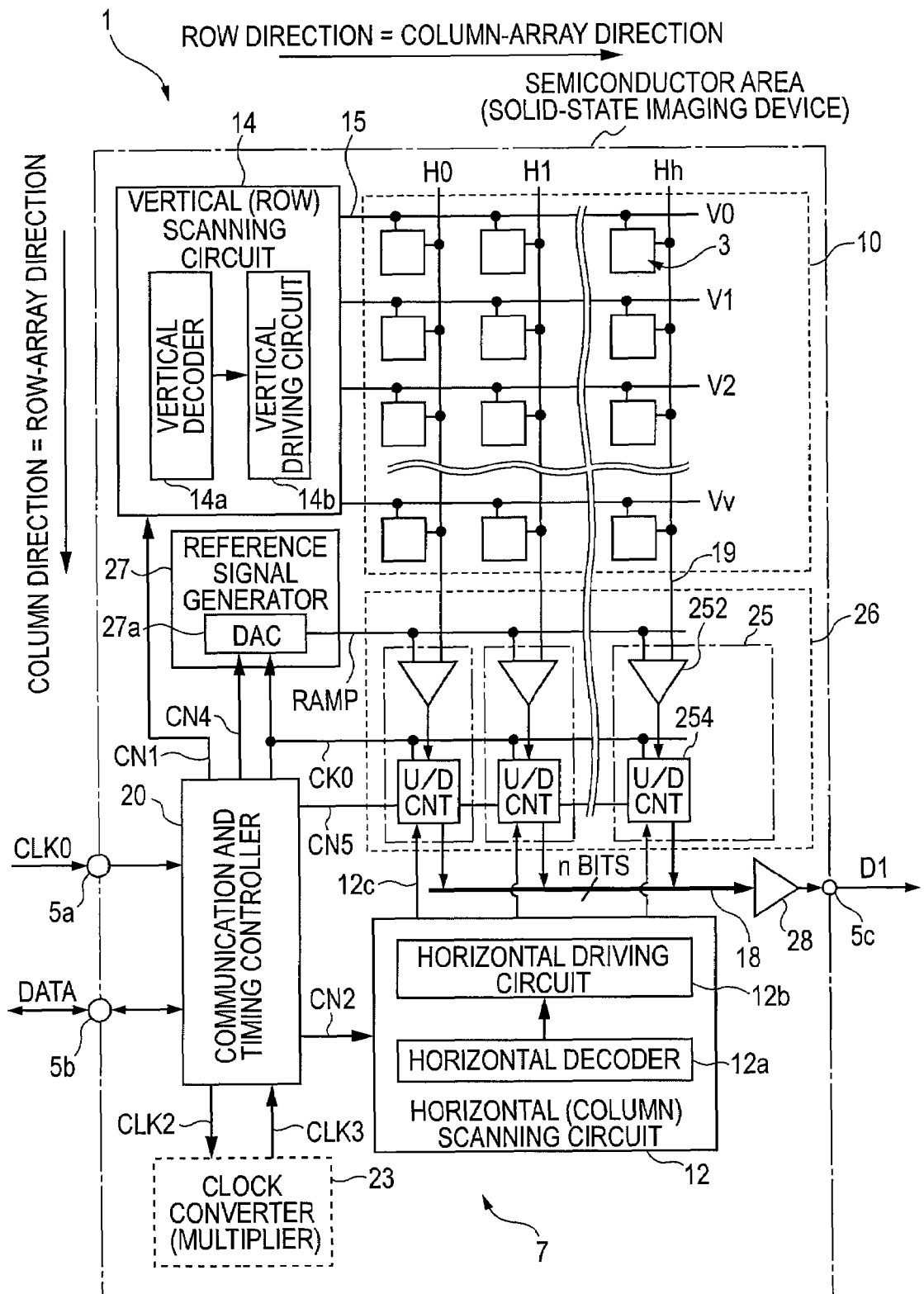
FIG. 1 is a schematic configuration diagram of a CMOS solid-state imaging device according to a first embodiment of the present invention.

FIG. 1 is a schematic configuration diagram of a CMOS solid-state imaging device (CMOS image sensor) 1 as an implementation of a semiconductor device according to a first embodiment of the present invention. The CMOS solid-state imaging device 1 is also an implementation of an electronic apparatus according to an embodiment of the present invention.

The solid-state imaging device 1 includes a pixel unit 10 having a plurality of pixels 3 arranged in rows and columns (or in a two-dimensional matrix). Each of the pixels 3 includes a photosensitive element (which is one example of charge generator) that outputs a voltage signal corresponding to the amount of incident light. In the solid-state imaging device 1, correlated double sampling (CDS) processors and analog-to-digital converters (ADCs) are provided in a column-parallel manner.

More specifically, a plurality of CDS processors and ADCs are provided substantially in parallel to vertical signal lines 19 of columns. The plurality of CDS processors and ADCs, when viewed in plan, may be provided on one end of the pixel unit 10 in the column direction (i.e., on the output side or on the lower side as viewed in FIG. 1), or may be separately provided on one end (i.e., on the output side or the lower side as viewed in FIG. 1) and on the other end (i.e., on the upper side as viewed in FIG. 1) of the pixel unit 10 in the column direction. In the latter arrangement, preferably, horizontal scanning units that perform scanning in the row direction (i.e., horizontal scanning) are provided separately on both ends of the pixel unit 10 in a manner that allows the horizontal scanning units to operate independently.

One typical column-parallel arrangement of CDS processors and ADCs is a column-based arrangement. In the column-based arrangement, a CDS processor and an ADC are provided for each column in a region located on the output side of an imaging unit, referred to as a column region, and signals are sequentially read out to the output side. Any arrangement other than the column-based arrangement may be used. For example, one CDS processor and one ADC may be provided in association with a set of a plurality of (e.g., two) adjacent vertical signal lines 19 (columns), or a CDS processor and an ADC may be provided in association with a set of every N-th (N is a positive integer, with (N−1) intervening lines) vertical signal line 19 (column).

In any arrangement other than the column-based arrangement, a plurality of vertical signal lines 19 (columns) share one CDS processor and one ADC, and a switching circuit (or a switch) is provided to feed pixel signals for the plurality of columns, supplied from the pixel unit 10, to the CDS processor and the ADC. Depending on the processing that is performed downstream, a memory may be needed for storing output signals.

In any case, an arrangement in which one CDS processor and one ADC are provided for a plurality of vertical signal lines 19 (columns) so that signal processing is performed on pixel signals after reading the pixel signals on a column-by-column basis allows simpler construction of each unit pixel than an arrangement in which similar signal processing is performed in individual unit pixels. A high-density pixel design, compact design, and low-cost design of the image sensor are thus achievable.

A plurality of signal processors arranged in a column-parallel manner allow pixel signals of one row to be processed in parallel at a time. The signal processors are allowed to operate at a low speed compared with a case where processing is performed by an output circuit or by a CDS processor and an ADC outside the device. This is advantageous in terms of power consumption, bandwidth performance, noise, etc. In other words, for the same power consumption and bandwidth performance, high-speed operation of the sensor as a whole is achievable.

The column-based arrangement allows low-speed operation, and is advantageous in terms of power consumption, bandwidth performance, noise, etc. Also advantageously, a switching circuit (or a switch) is not needed. The following embodiments will be described in the context of a column-based solid-state imaging device unless otherwise stated.

As shown in FIG. 1, the solid-state imaging device 1 according to the first embodiment includes the pixel unit (imaging unit) 10 in which the plurality of unit pixels 3 are arranged in rows and columns, a driving controller 7 provided outside the pixel unit 10, a column processor 26, a reference signal generator 27 that supplies a reference voltage for A/D conversion to the column processor 26, and an output circuit 28.

An automatic gain control (AGC) circuit having a signal amplification function may be placed upstream or downstream of the column processor 26, as necessary, in the same semiconductor region as the column processor 26. When the AGC circuit is placed upstream of the column processor 26, analog amplification is carried out. When the AGC circuit is placed downstream of the column processor 26, digital amplification is carried out. Preferably, analog amplification is performed prior to conversion into digital signals because signal levels could be degraded if n-bit digital data is simply amplified.

The driving controller 7 has a control circuit function for sequentially reading signals from the pixel unit 10. The driving controller 7 includes, for example, a horizontal scanning circuit (column scanning circuit) 12 that controls column addressing or column scanning, a vertical scanning circuit (row scanning circuit) 14 that controls row addressing or row scanning, and a communication and timing controller 20 that generates an internal clock.

The solid-state imaging device 1 may further include a clock converter 23, surrounded by a dotted-line box, in the vicinity of the communication and timing controller 20. The clock converter 23 is an exemplary high-speed clock generator that generates pulses having a higher clock frequency than an input clock frequency. The communication and timing controller 20 generates an internal clock based on an input clock (master clock) CLK0 that is input via a terminal 5a or a high-speed clock generated by the clock converter 23.

The signals based on the high-speed clock generated by the clock converter 23 allow high-speed A/D conversion. The high-speed clock can be used to perform motion extraction or compression that uses high-speed computations. Parallel data output from the column processor 26 can be converted into serial data, and the serial data can be output as video data D1 from the imaging device 1. This allows a high-speed output operation using terminals of lower bits than the bits of the A/D converted digital data.

The clock converter 23 includes a multiplier circuit that generates pulses having a higher clock frequency than an input clock frequency. The clock converter 23 receives a low-speed clock CLK2 from the communication and timing controller 20, and generates a clock having at least twice as high as the low-speed clock CLK2. The multiplier circuit of the clock converter 23 may be a k1-multiplier circuit, where k1 denotes a multiple of the frequency of the low-speed clock CLK2, and can be implemented using any of various known circuits.

Although only some rows and columns of the pixels are illustrated in FIG. 1 for simplicity, several tens to several thousands of unit pixels 3 are actually arranged on each row and each column. Each of the unit pixels 3 typically includes a photodiode acting as a photosensitive element (charge generator), and an in-pixel amplifier having an amplifying semiconductor element (e.g., a transistor).

The in-pixel amplifier may be of the floating-diffusion amplifier structure. In relation to the charge generator, four transistors may be used, by way of example, namely, a read-select transistor acting as an exemplary charge reader (transfer gate/read gate), a reset transistor acting as a reset gate, a vertical-select transistor, and a source-follower amplifying transistor acting as an detector element that detects a change in the potential of the floating diffusion. The four-transistor configuration is typical in a CMOS sensor.

Alternatively, as disclosed in Japanese Patent Publication No. 2708455, an arrangement including three transistors may be used, namely, an amplifying transistor, connected to a drain line (DRN), for amplifying a signal voltage corresponding to a signal charge generated by the charge generator, a reset transistor for resetting the charge generator, a read-select transistor (transfer gate) that is scanned by a vertical shift register via a transfer line (TRF).

The horizontal scanning circuit 12, the vertical scanning circuit 14, and the communication and timing controller 20 are provided as other components of the driving controller 7. The horizontal scanning circuit 12 functions as a reading-scanning unit that reads a count value from the column processor 26. The components of the driving controller 7 are formed together with the pixel unit 10 in a semiconductor region of single-crystal silicon or the like using a similar technique to a semiconductor integrated circuit manufacturing process to form a solid-state imaging device as an example of a semiconductor system.

The unit pixels 3 are connected to the vertical scanning circuit 14 via row control lines 15 for row selection, and are connected to the column processor 26 via vertical signal lines 19. The column processor 26 includes column A/D circuits 25 provided arranged for the respective columns. The row control lines 15 generally refer to lines routed from the vertical scanning circuit 14 to pixels.

The horizontal scanning circuit 12 includes a horizontal decoder 12a, and the vertical scanning circuit 14 includes a vertical decoder 14a, as described below. The horizontal scanning circuit 12 and the vertical scanning circuit 14 start shifting (or scanning) in response to control signals CN2 and CN1 from the communication and timing controller 20. The row control lines 15 include lines for transferring various pulse signals for driving the unit pixels 3 (e.g., a reset pulse RST, a transfer pulse TRF, and a DRN control pulse DRN).

The communication and timing controller 20 includes a timing generator (TG) (as a read-address controller) function block (not shown) and a communication interface function block (not shown). The TG function block supplies clocks needed for the operation of the components and pulse signals having a predetermined timing. The communication interface function block receives the master clock CLK0 via the terminal 5a and data DATA for instructing an operation mode or the like via a terminal 5b, and outputs data including information relating to the solid-state imaging device 1.

For example, the communication and timing controller 20 outputs a horizontal address signal to the horizontal decoder 12a and a vertical address signal to the vertical decoder 14a. In response to the signals, the decoders 12a and 14a select a row and a column, respectively.

Since the unit pixels 3 are arranged in a two-dimensional matrix, it is appropriate to perform vertical scanning, followed by horizontal scanning, to read pixel signals and pixel data at a high speed. In the vertical scanning, analog pixel signals that are generated by pixel signal generators and that are output in the column direction via the vertical signal lines 19 are accessed and captured on a row-by-row basis (in a column-parallel manner). In the horizontal scanning, the pixels 3 are accessed in the row direction, i.e., the column-array direction, to read pixel signals (in this embodiment, digital pixel data) to the output side. Instead of the scanning, only information relating to desired unit pixels 3 may be read by random access by directly addressing the desired unit pixels 3.

The communication and timing controller 20 according to the first embodiment supplies a clock CLK1 having the same frequency as the master clock CLK0 input via the terminal 5a or a low-speed clock CLK2 that is obtained by frequency-dividing the master clock CLK0 by 2 or more to the components in the imaging device 1, such as the horizontal scanning circuit 12, the vertical scanning circuit 14, and the column processor 26. The low-speed clock CLK2 includes the clock having the half frequency and clocks having lower frequencies.

The vertical scanning circuit 14 selects a row of the pixel unit 10, and supplies necessary pulses to the selected row. The vertical scanning circuit 14 includes, for example, the vertical decoder 14a and a vertical driving circuit 14b. The vertical decoder 14a defines a row to be read in the vertical direction (or selects a row of the pixel unit 10). The vertical driving circuit 14b supplies pulses to the row control lines 15 for the unit pixels 3 on the read addresses (in the row direction) defined by the vertical decoder 14a for driving. In addition to a row for reading signals, the vertical decoder 14a also selects a row for an electronic shutter or the like.

The horizontal scanning circuit 12 sequentially selects the column A/D circuits 25 of the column processor 26 in synchronization with the low-speed clock CLK2, and transfers signals of the selected column A/D circuits 25 to horizontal signal lines (horizontal output lines) 18. The horizontal scanning circuit 12 includes, for example, the horizontal decoder 12a and a horizontal driving circuit 12b. The horizontal decoder 12a defines a column to be read in the horizontal direction (or selects the individual column A/D circuit 25 in the column processor 26). The horizontal driving circuit 12b transfers signals of the column processor 26 to the horizontal signal lines 18 according to the read addresses defined by the horizontal decoder 12a. The number of horizontal signal lines 18 corresponding to the number of n bits of signals handled by the column A/D circuits 25, where n is a positive integer. For example, if the number of bits is 10 (n=10), 10 horizontal signal lines 18 are provided accordingly.

In the thus constructed solid-state imaging device 1, pixel signals output from the unit pixels 3 are supplied to the column A/D circuits 25 of the column processor 26 via the vertical signal lines 19 on a column-by-column basis.

Each of the column A/D circuits 25 of the column processor 26 receives signals from pixels of one column and processes the signals. Each of the column A/D circuits 25 includes an analog-to-digital converter (ADC) circuit that converts analog signals into, for example, 10-bit digital data using the low-speed clock CLK2.

The details of the ADC circuit configuration are discussed below. The ADC circuit starts counting based on a clock signal when a ramped reference voltage RAMP is supplied to a comparator (a voltage comparator 252). Analog pixel signals input via the vertical signal lines 19 are compared with the reference voltage RAMP to perform counting until pulse signals are obtained, thereby perform A/D conversion.

The circuit configuration may be designed so that, with respect to voltage-mode pixel signals input via the vertical signal lines 19, the difference between a signal level (noise level) immediately after pixel resetting and a true signal level Vsig (corresponding to the amount of light received) can be calculated concurrently with A/D conversion. Thus, a noise signal component called fixed pattern noise (FPN) or reset noise is removed.

Digital pixel data generated by the column A/D circuits 25 is transferred to the horizontal signal lines 18 via a horizontal selection switch (not shown) that is driven by horizontal selection signals from the horizontal scanning circuit 12, and is then input to the output circuit 28. The number of bits is not limited to 10, and may be less than 10 (e.g., 8) or greater than 10 (e.g., 14).

In this way, pixel signals for the respective columns are sequentially output on a row-by-row basis from the pixel unit 10 including a matrix of photosensitive elements acting as charge generators. A frame image, i.e., an image corresponding to the pixel unit 10 including the matrix of photosensitive elements is shown as a collection of pixel signals of the overall pixel unit 10.

The details of the column A/D circuits 25 and the reference signal generator 27 will now be described.

The reference signal generator 27 includes a digital-to-analog converter (DAC) 27a. In synchronization with a count clock CK0, the reference signal generator 27 generates a stepped sawtooth-waveform (or ramp-waveform) signal from an initial value indicated by control data CN4 from the communication and timing controller 20. The reference signal generator 27 then supplies the ramp-waveform signal as a reference voltage for A/D conversion (ADC reference signal) to the individual column A/D circuits 25 of the column processor 26. An anti-noise filter (not shown) may be provided.

The stepped sawtooth-waveform signal that is generated based on a high-speed clock supplied from the clock converter 23, e.g., a multiplied clock generated by the multiplier circuit, changes more rapidly than a stepped sawtooth-waveform signal that is generated based on the master clock CLK0 input via the terminal 5a.

The control data CN4 supplied from the communication and timing controller 20 to the D/A converter 27a of the reference signal generator 27 includes information that provides the same rate of change of digital data with respect to time so that the gradient (rate of change) of the ramp voltages is the same between comparison operations. More specifically, the count value is changed by 1 per unit time.

Each of the column A/D circuits 25 includes a voltage comparator 252 and a counter 254, and has a function of n-bit A/D conversion. The voltage comparator 252 compares the reference voltage RAMP generated by the DAC 27a of the reference signal generator 27 with analog pixel signals obtained from the unit pixels 3 via the vertical signal lines 19 (H0, H1, . . . ) for each of the row control lines 15 (V0, V1, . . . ). The counter 254 counts the time required by the voltage comparator 252 to finish its comparison operation, and stores the count value.

The communication and timing controller 20 has a function of a controller that switches the mode of counting in the counter 254 depending on whether the voltage comparator 252 performs the comparison operation on a reset component ΔV or signal component Vsig of a pixel signal. A control signal CN5 for instructing whether the counter 254 is to operate in a down-count mode or an up-count mode is supplied from the communication and timing controller 20 to the counter 254 of the column A/D circuit 25.

The ramp reference voltage RAMP generated by the reference signal generator 27 is commonly fed to input terminals RAMP of the voltage comparators 252, and individual pixel signal voltages from the pixel unit 10 are fed to the other input terminals of the voltage comparators 252 that are connected to the vertical signal lines 19 of the associated columns. The signals output from the voltage comparators 252 are supplied to the counter 254.

The count clock CK0 is commonly fed to clock terminals CK of the counters 254 from the communication and timing controller 20.

Figure 9:
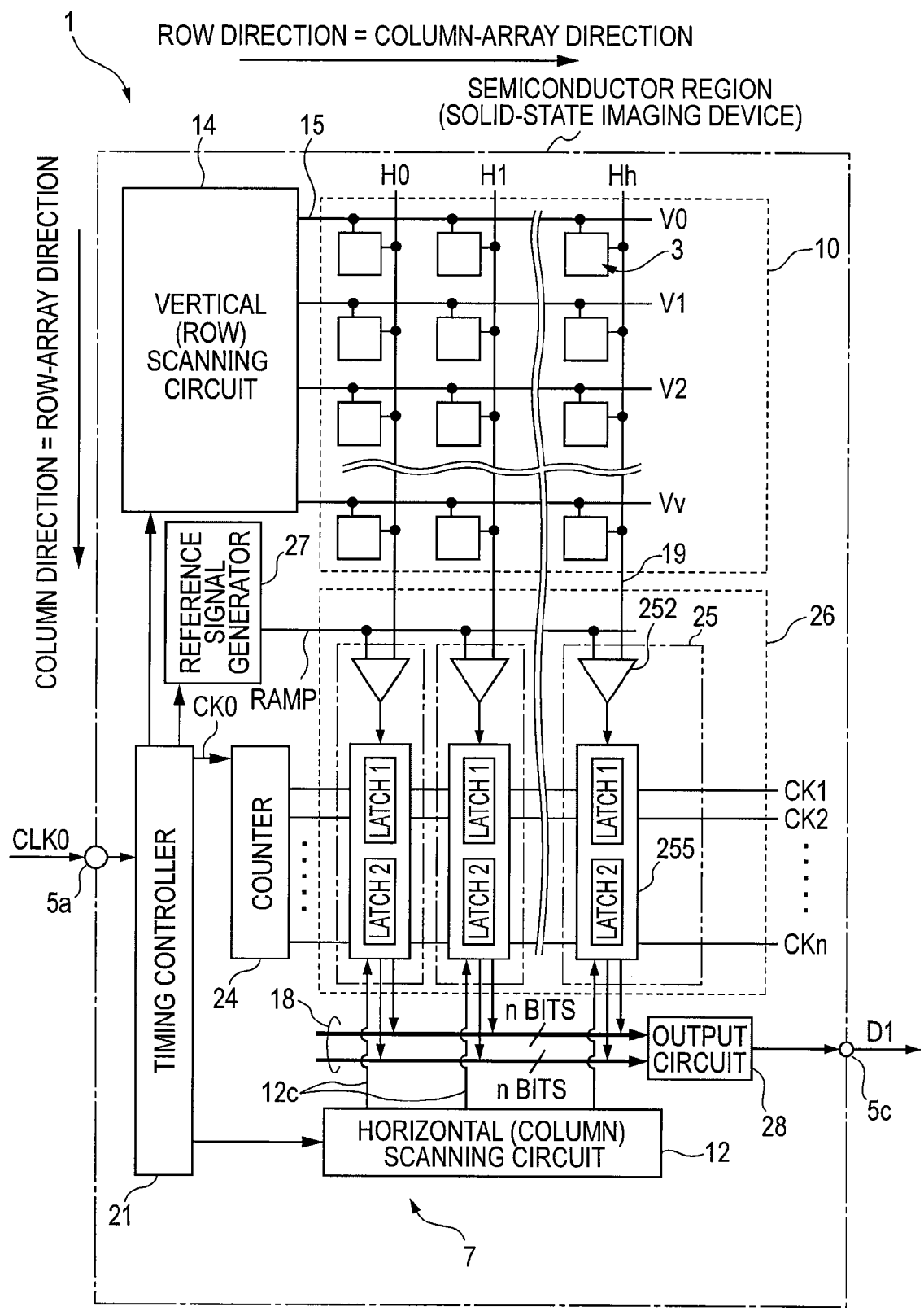
FIG. 9 is a schematic configuration diagram of a CMOS solid-state imaging device of the related art in which a pixel unit and an A/D converter are mounted on the same semiconductor substrate.
Figure 10:
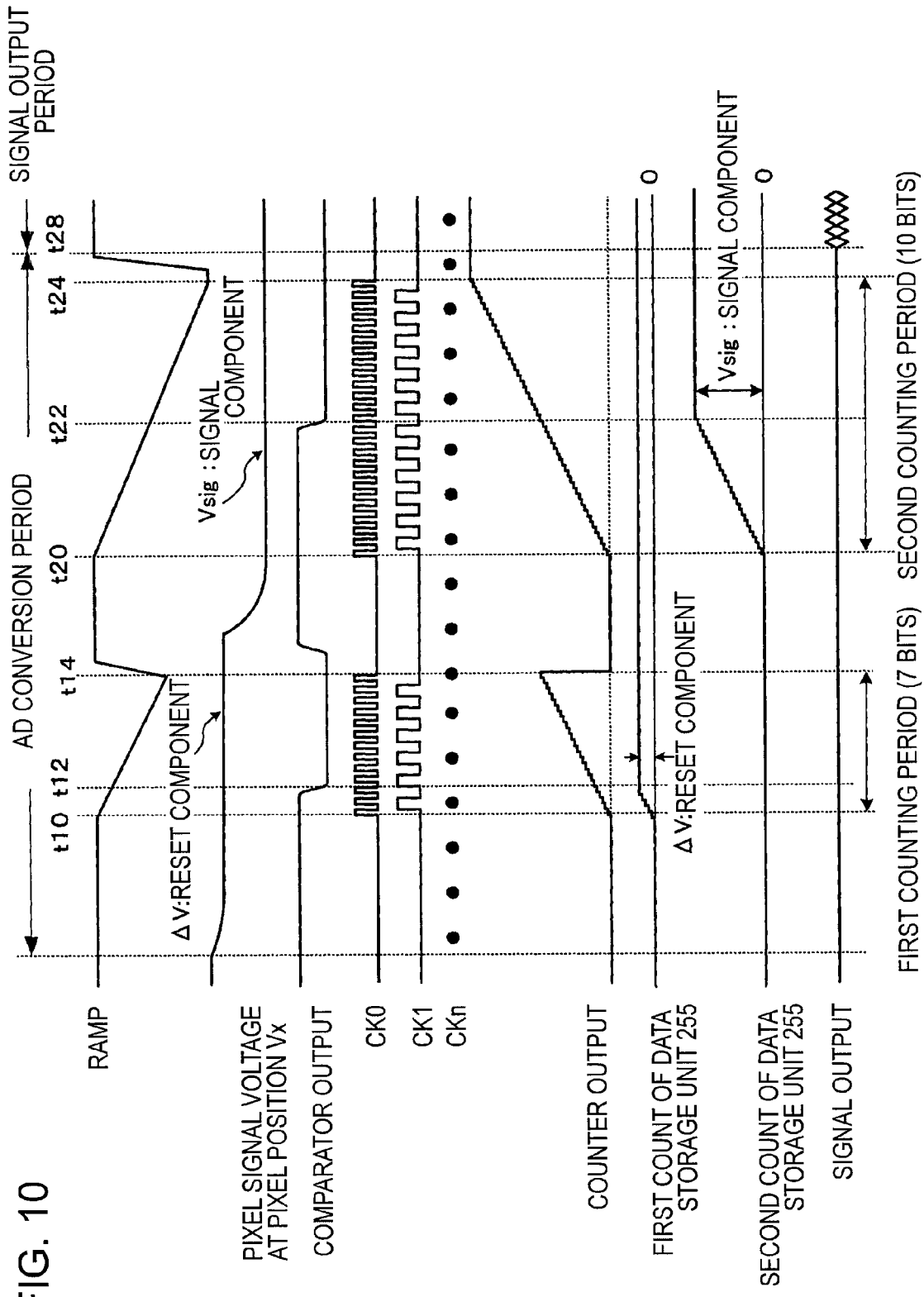
FIG. 10 is a timing chart for illustrating an operation of the solid-state imaging device of the related art shown in FIG. 9.

Each of the counters 254 is implemented by modifying the wiring design of the data storage unit 255 with the latches shown in FIG. 9 into that of a synchronous counter, although the configuration of the counter 254 is not illustrated. The counter 254 performs internal counting in response to the single count clock CK0. Similarly to the stepped voltage waveform, the count clock CK0 that is generated based on a high-speed clock (e.g., a multiplied clock) supplied from the clock converter 23 changes more rapidly than a count clock that is generated based on the master clock CLK0 input via the terminal 5a.

The counters 254 of n bits are implemented by a combination of n latches, and the circuit size of the counter 254 is therefore reduced to half of the circuit size of the data storage unit 255 constructed of two sets of n latches shown in FIG. 9. Since the counter 24 shown in FIG. 9 is not needed, the overall circuit size is considerably smaller than that shown in FIG. 9.

As is described below in detail, each of the counters 254 according to the first embodiment is an up-down counter (U/D CNT), irrespective of the counting mode, capable of switching between (more specifically, alternately performing) a down-counting operation and an up-counting operation. Each of the counters 254 according to the first embodiment is also a synchronous counter that outputs a count value in synchronization with the count clock CK0.

In the synchronous counter, the operation of all flip-flops (basic elements of the counter) is controlled by the count clock CK0. Thus, an asynchronous counter is preferably used as each of the counter 254 for the purpose of a higher-frequency operation. The asynchronous counter is suitable for a high-speed operation because its operation limit frequency is determined only by the limit frequency of the first flip-flop (basic element of the counter).

Control pulses are fed to the counters 254 from the horizontal scanning circuit 12 via control lines 12c. Each of the counters 254 has a latch function for storing a result of counting, and stores the count value until a control-pulse instruction is supplied via the control line 12c.

As described above, the thus constructed column A/D circuits 25 are provided for the respective vertical signal lines 19

(H0, H1, . . . ), to construct the column processor 26, which is a column-parallel ADC block.

The outputs of the individual column A/D circuits 25 are connected to the horizontal signal lines 18. As described above, the horizontal signal lines 18 include signal lines of n bits corresponding to the bit width of the column A/D circuits 25. The horizontal signal lines 18 are connected to the output circuit 28 via n sensing circuits (not shown) associated with the respective output lines.

With this construction, the column A/D circuits 25 perform counting in a pixel-signal reading period corresponding to a horizontal blanking period, and output count values at a predetermined timing. In each of the column A/D circuits 25, first, the voltage comparator 252 compares the ramp-waveform voltage supplied from the reference signal generator 27 with the pixel signal voltage input via the vertical signal line 19. When both voltages become equal, the voltage comparator 252 inverts its output (from a high level to a low level in this embodiment).

The counter 254 starts counting in the down-count mode or up-count mode in synchronization with the ramp-waveform voltage output from the reference signal generator 27. Upon receipt of the inversion of the output of the voltage comparator 252, the counter 254 stops counting, and latches (holds or stores) the current count value as pixel data. A/D conversion is thus completed.

In accordance with a shifting operation in response to a horizontal selection signal CH(i) input via the control line 12c from the horizontal scanning circuit 12 at a predetermined timing, the counter 254 sequentially outputs the stored pixel data to the outside of the column processor 26 or to the outside of the chip having the pixel units 10 via an output terminal 5c.

The solid-state imaging device 1 may include other various signal processing circuits (not shown) which are not directly related to the first embodiment.

Figure 2:
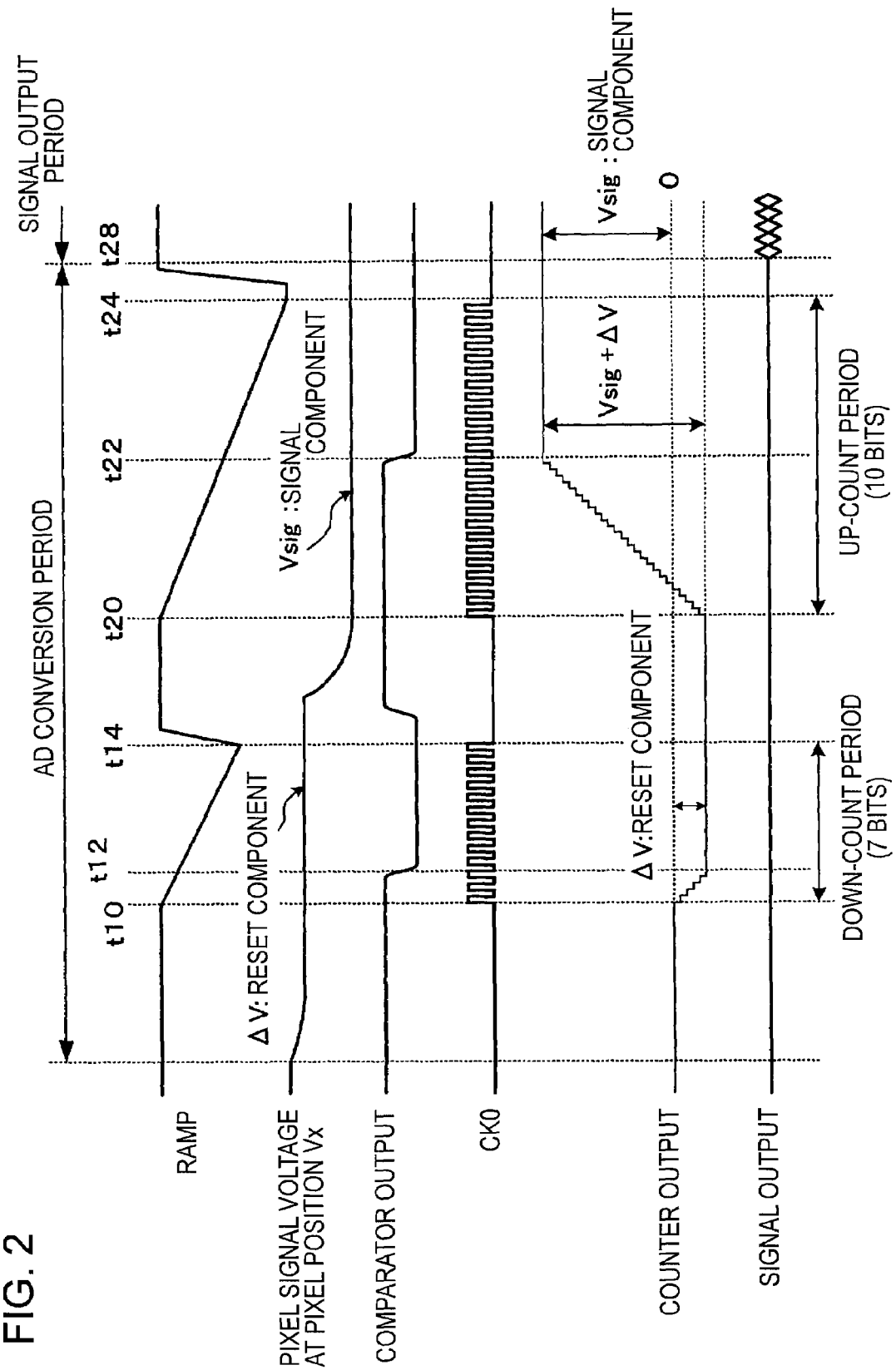
FIG. 2 is a timing chart for illustrating an operation of a column A/D circuit of the solid-state imaging device according to the first embodiment shown in FIG. 1.

FIG. 2 is a timing chart for illustrating an operation of the column A/D circuits 25 in the solid-state imaging device 1 according to the first embodiment shown in FIG. 1.

Analog pixel signals sensed by the unit pixels 3 of the pixel unit 10 are converted into digital signals as below. For example, a point where the ramp-waveform reference voltage RAMP that decreases at a predetermined gradient matches the voltage of a reference component or signal component in a pixel signal from each of the unit pixels 3 is detected. Then, counting is performed based on a count clock between the time when the reference voltage RAMP used for the comparison is generated and the time when the signal corresponding to the reference component or signal component in the pixel signal matches the reference signal, thereby determining a count value corresponding to the magnitude of the reference component or the signal component.

In the pixel signal output from the vertical signal line 19, the signal component Vsig temporally appears after the reset component ΔV including noise of the pixel signal as the reference component. In a case where a first process is performed on the reference component (the reset component ΔV), a second process is performed on a signal representing a sum of the reference component (the reset component ΔV) and the signal component Vsig. The details will now be described.

For the first reading operation, the communication and timing controller 20 resets the count value of the counter 254 to an initial value of 0, and sets the counter 254 to the down-count mode. After the first reading operation of reading pixel signals from the unit pixels 3 on an arbitrary row Hx to the vertical signal lines 19 (H0, H1, . . . ) becomes stable, the communication and timing controller 20 supplies the control data CN4 for generating the reference voltage RAMP to the reference signal generator 27.

In response to the control data CN4, the reference signal generator 27 inputs a stepped ramp waveform to the input terminal RAMP of the voltage comparator 252 as a comparative voltage. The stepped ramp waveform changes over time so as to generally form a sawtooth (or ramp) waveform. The voltage comparator 252 compares the ramp-waveform comparative voltage with a pixel signal voltage on an arbitrary vertical signal line 19 (Vx) supplied from the pixel unit 10.

In synchronization with the ramp-waveform voltage output from the reference signal generator 27 (at time t10), the count clock CK0 is input from the communication and timing controller 20 to the clock terminal of the counter 254 to start the first counting operation of performing down-counting from the initial value of 0 in order to measure a comparison time of the voltage comparators 252 using the counter 254 provided for each row in response to the reference voltage RAMP input to the input terminal RAMP of the voltage comparator 252. That is, counting is started in the negative direction.

The voltage comparator 252 compares the ramp-waveform reference voltage RAMP from the reference signal generator 27 with a pixel signal voltage Vx input via the vertical signal line 19. When both voltages become equal, the voltage comparator 252 inverts its output from a high level to a low level (at time t12). Specifically, the voltage comparator 252 compares a voltage signal corresponding to a reset component Vrst with the reference voltage RAMP, and generates an active-low pulse signal having a magnitude in the time domain corresponding to the magnitude of the reset component Vrst. The active-low pulse signal is then supplied to the counter 254.

In response to the pulse signal, the counter 254 stops counting substantially at the same time as the inversion of the output of the voltage comparator 252, and latches (holds or stores) the current count value as pixel data. A/D conversion is thus completed (at time t12). The width of the active-low pulse signal having a magnitude in the time domain that is obtained by the voltage comparator 252 performing comparison is counted based on the count clock CK0, thereby determining a count value corresponding to the magnitude of the reset component Vrst.

When a predetermined down-count period elapses (at time t14), the communication and timing controller 20 stops the supply of control data to the voltage comparator 252 and the supply of the count clock CK0 to the counter 254. The voltage comparator 252 thus stops generating the ramped reference voltage RAMP.

In the first reading operation, counting is performed with respect to the reset level Vrst of the pixel signal voltage Vx that is detected by the voltage comparator 252. In the first reading operation, therefore, the reset component ΔV of the unit pixel 3 is read.

The reset component ΔV includes noise that varies depending on the unit pixel 3 as an offset. The variations in the reset component ΔV are generally small, and the reset level Vrst is substantially common to all pixels. Thus, the output of the reset component ΔV in the pixel signal voltage Vx on an arbitrary vertical signal line 19 is substantially known.

Thus, in the first reading operation of reading the reset component ΔV, the down-count period (the comparison period from t10 to t14) can be reduced by adjusting the RAMP voltage. In the first embodiment, the maximum period of comparison for the reset component ΔV is a counting period corresponding to 7 bits (128 clock cycles).

In the second reading operation, a signal component Vsig corresponding to the amount of light incident on each of the unit pixels 3 is read in addition to the reset component ΔV, and a similar operation to that of the first reading operation is performed. The communication and timing controller 20 first sets the counter 254 to the up-count mode. Then, after the second reading operation of reading pixel signals from the unit pixels 3 on an arbitrary row Hx to the vertical signal lines 19 (H0, H1, ...) becomes stable, the communication and timing controller 20 supplies the control data CN4 for generating the reference voltage RAMP to the reference signal generator 27.

In response to the control data CN4, the reference signal generator 27 inputs a stepped ramp waveform to the input terminal RAMP of the voltage comparator 252 as a comparative voltage. The stepped ramp waveform changes over time so as to generally form a sawtooth (or ramp) waveform. The voltage comparator 252 compares the ramp-waveform comparative voltage with a pixel signal voltage on an arbitrary vertical signal line 19 (Vx) supplied from the pixel unit 10.

In synchronization with the ramp-waveform voltage output from the reference signal generator 27 (at time t20), the count clock CK0 is input from the communication and timing controller 20 to the clock terminal of the counter 254 to start the second counting operation of performing up-counting from the count corresponding to the reset component ΔV of the unit pixel 3 obtained in the first reading operation in order to measure a comparison time of the voltage comparators 252 using the counter 254 provided for each row in response to the reference voltage RAMP input to the input terminal RAMP of the voltage comparator 252. That is, counting is started in the positive direction.

The voltage comparator 252 compares the ramp-waveform reference voltage RAMP from the reference signal generator 27 with a pixel signal voltage Vx input via the vertical signal line 19. When both voltages become equal, the voltage comparator 252 inverts its output from a high level to a low level (at time t22). Specifically, the voltage comparator 252 compares a voltage signal corresponding to the signal component Vsig with the reference voltage RAMP, and generates an active-low pulse signal having a magnitude in the time domain corresponding to the magnitude of the signal component Vsig. The active-low pulse signal is then supplied to the counter 254.

In response to the pulse signal, the counter 254 stops counting substantially at the same time as the inversion of the output of the voltage comparator 252, and latches (holds or stores) the current count value as pixel data. The A/D conversion is thus completed (at time t22). The width of the active-low pulse signal having a magnitude in the time domain that is obtained by the voltage comparator 252 performing comparison is counted based on the count clock CK0, thereby determining a count value corresponding to the magnitude of the signal component Vsig.

When a predetermined up-count period elapses (at time t24), the communication and timing controller 20 stops the supply of control data to the voltage comparator 252 and the supply of the count clock CK0 to the counter 254. The voltage comparator 252 thus stops generating the ramped reference voltage RAMP.

In the second reading operation, counting is performed with respect to the signal component Vsig of the pixel signal voltage Vx that is detected by the voltage comparator 252. In the second operation, therefore, the signal component Vsig of the unit pixel 3 is read.

In the first embodiment, the counter 254 performs down-counting in the first reading operation and performs up-counting in the second reading operation. The counter 254 automatically performs subtraction as below, and a count value determined by the subtraction is stored in the counter 254.
(count value obtained in the second comparison period)−(count value obtained in the first comparison period) (1)

The subtraction given by formula (1) above can be rearranged as follows: (second comparison period)−(first comparison period)=(signal component Vsig+reset component ΔV+offset component of column A/D circuit 25)−(reset component ΔV+offset component of column A/D circuit 25)= (signal component Vsig) (2) The count value stored in the counter 254 is therefore the count value corresponding to the signal component Vsig.

Thus, the above-described subtraction is performed by the counter 254 using the two reading and counting operations, i.e., down-counting in the first reading operation and up-counting in the second reading operation, thereby removing the reset component ΔV including variations for each of the unit pixels 3 and the offset component for each of the column A/D circuits 25. Only the signal component Vsig corresponding to the amount of light incident on each of the unit pixels 3 can be extracted with a simple arrangement. Advantageously, reset noise can also be removed.

Therefore, each of the column A/D circuits 25 according to the first embodiment acts as both an ADC that converts analog pixel signals into digital pixel data and a CDS processor.

The pixel data represented by the count value determined by formula (2) above indicates a positive signal voltage. There is no need for complement operation, and high compatibility with existing systems is achieved.

In the second reading operation, the signal component Vsig corresponding to the amount of incident light is read. In order to measure the amount of light in a wide range of levels, the up-count period (the comparison period from t20 to t24) is set long so that the ramp voltage to be supplied to the voltage comparator 252 largely changes.

In the first embodiment, the maximum period of comparison for the signal component Vsig is chosen to be a count period of 10 bits (1024 clock cycles). That is, the maximum period of comparison for the reset component ΔV (reference component) is set shorter than that for the signal component Vsig. Instead of setting the same maximum period of comparison, i.e., maximum period of .DELTA./D conversion, for the reset component ΔV (reference component) and the signal component Vsig, the maximum period of comparison for the reset component ΔV (reference component) is set shorter than that for the signal component vsig, thereby reducing the total A/D conversion period over the two iterations of A/D conversion.

In this case, the number of bits of comparison differs between the first iteration and the second iteration. However, the communication and timing controller 20 supplies control data to the reference signal generator 27, and the reference signal generator 27 generates a ramp voltage based on the control data, thereby allowing the gradient of the ramp voltage, i.e., the rate of change of the reference voltage RAMP, to be the same between the first iteration and the second iteration. Since the ramp voltage is generated by digital control, the same gradient of the ramp voltage is easily maintained between the first iteration and the second iteration. This allows the iterations of A/D conversion with the same accuracy, and allows the up-down counter to determine a correct count value as a result of the subtraction given by formula (1) above.

At a predetermined timing (t28) after the second counting operation is completed, the communication and timing controller 20 instructs the horizontal scanning circuit 12 to read the pixel data. In response to the instruction, the horizontal scanning circuit 12 sequentially shifts the horizontal selection signal CH(i) to be supplied to the counter 254 via the control line 12c.

Thus, the count values determined by formula (2) above and stored in the counters 254, i.e., n-bit digital pixel data, are sequentially output from the output terminal 5c to the outside of the column processor 26 or to the outside of the chip having the pixel unit 10 via the n horizontal signal lines 18. A similar operation is repeatedly performed for each row, thereby producing the video data D1 representing a two-dimensional image.

Therefore, in the solid-state imaging device according to the first embodiment, an up-down counter is used to perform two counting operations while switching the operation mode of the up-down counter. In an arrangement in which the unit pixels 3 are arranged in a matrix, the column A/D circuits 25 are column-parallel column A/D circuits provided for the respective columns.

Thus, it is possible to directly subtract a reference component (reset component) from a signal component for each column as a result of the second counting operation. Memories for storing the count value for the reference component and the count value for the signal component are implemented by the latch function of the counter, and no dedicated memory for storing A/D converted data is needed separately from the counter.

Furthermore, there is no need for a special subtractor for calculating a difference between the reference component and the signal component. Thus, the circuit size and the circuit area are reduced over the related art. This serves to avoid increase in noise, current, or power consumption.

Since a column A/D circuit (A/D converter) includes a comparator and a counter, counting can be controlled irrespective of the number of bits by a single count clock for operating the counter and a control line for switching the count mode of the counter. There is no need for signal lines for transferring a count value of the counter to memories, which are needed in the related art. This serves to avoid increase in noise or power consumption.

In the solid-state imaging device 1 with an A/D converter mounted on the same chip, therefore, each of the column A/D circuits 25 serving as A/D converters is constructed of a set of the voltage comparator 252 and the counter 254. The counter 254 performs down-counting and up-counting in combination. The difference between a reference component (reset component in the first embodiment) and signal component of a signal to be processed is converted into digital data. Thus, problems with the size, the circuit area, the power consumption, the number of lines for interfacing with other functional units, noise or current consumption due to the lines, etc. are overcome.

Second Embodiment

Figure 3:
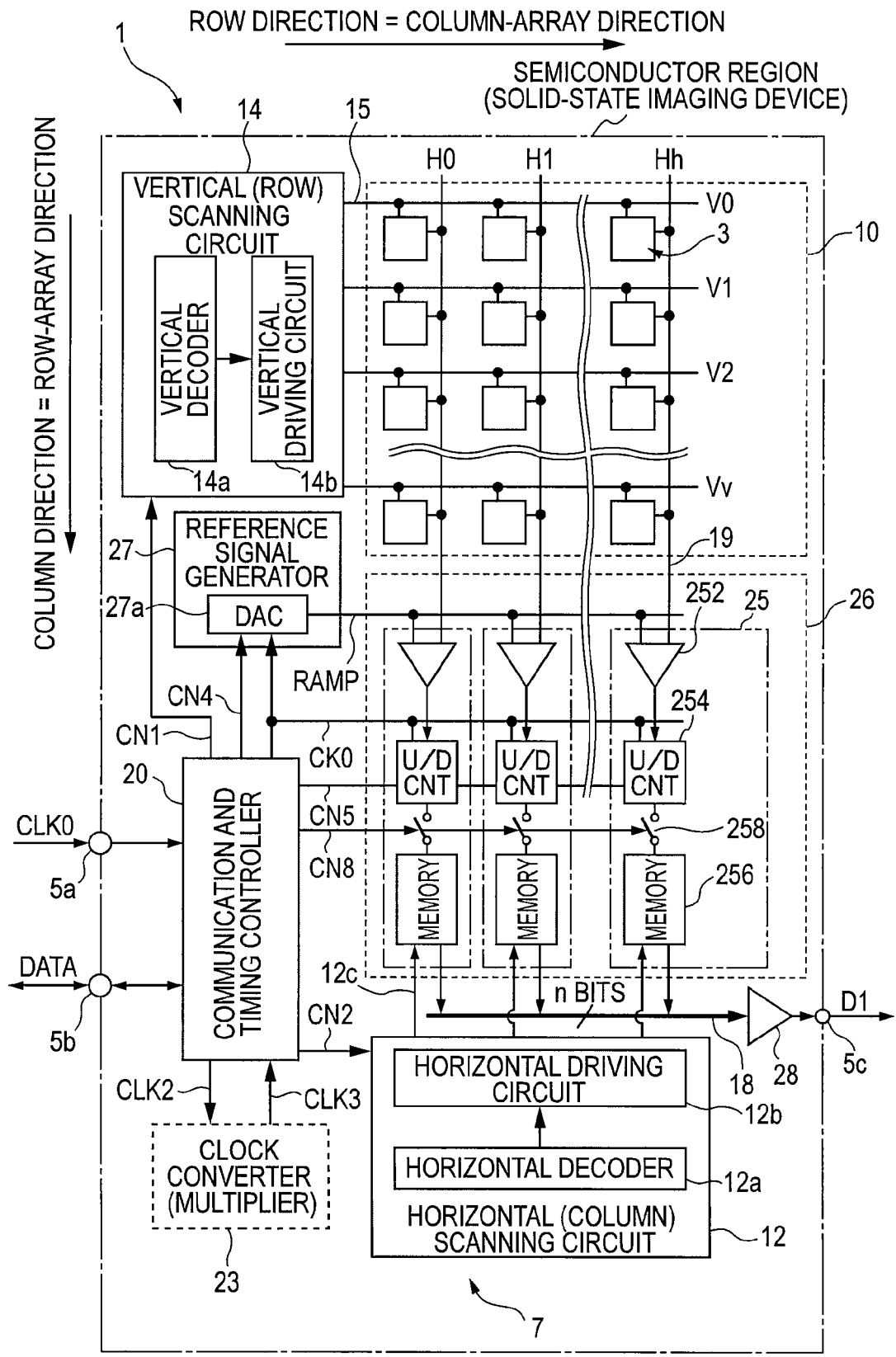
FIG. 3 is a schematic configuration diagram of a CMOS solid-state imaging device according to a second embodiment of the present invention.

FIG. 3 is a schematic configuration diagram of a CMOS solid-state imaging device (CMOS image sensor) 1 according to a second embodiment of the present invention. In the solid-state imaging device 1 according to the second embodiment, each of the column A/D circuits 25 according to the first embodiment is modified.

Each of column A/D circuits 25 according to the second embodiment includes a counter 254, a data storage unit 256 serves as an n-bit memory, and a switch 258. The data storage unit 256 is placed downstream of the counter 254, and stores a count value stored in the counter 254. The switch 258 is placed between the counter 254 and the data storage unit 256.

A memory-transfer instruction pulse CN8 is commonly supplied as a control pulse at a predetermined timing from the communication and timing controller 20 to the switches 258 provided for the respective columns. In response to the memory-transfer instruction pulse CN8, each of the switches 258 transfers the count value of the associated counter 254 to the data storage unit 256. The data storage unit 256 stores the incoming count value.

The arrangement in which the count value of the counter 254 is stored in the data storage unit 256 at a predetermined timing is not limited to the provision of the switch 258 placed between the counter 254 and the data storage unit 256. For example, the counter 254 and the data storage unit 256 may directly be connected to each other while controlling the output-enable of the counter 254 by the memory-transfer instruction pulse CN8. Alternatively, the memory-transfer instruction pulse CN8 may be used as a latch clock for determining the timing for the data storage unit 256 to capture data.

The data storage units 256 receive control pulses from the horizontal scanning circuit 12 via the control lines 12c. The data storage units 256 store the count values received from the counters 254 until a control-pulse instruction is supplied via the control lines 12c.

The horizontal scanning circuit 12 functions as a reading-scanning unit that reads a count value stored in each of the data storage units 256 concurrently with the voltage comparators 252 and the counters 254 of the column processor 26 performing the respective operations.

According to the second embodiment, it is possible to transfer the count values stored in the counters 254 to the data storage units 256. Thus, the counting operation of the counters 254, i.e., the A/D conversion operation, and the operation to read out the count values to the horizontal signal line 18 can independently be controlled, thereby achieving a pipeline arrangement that allows the A/D conversion operation and the signal reading operation to be performed in parallel.

Figure 4:
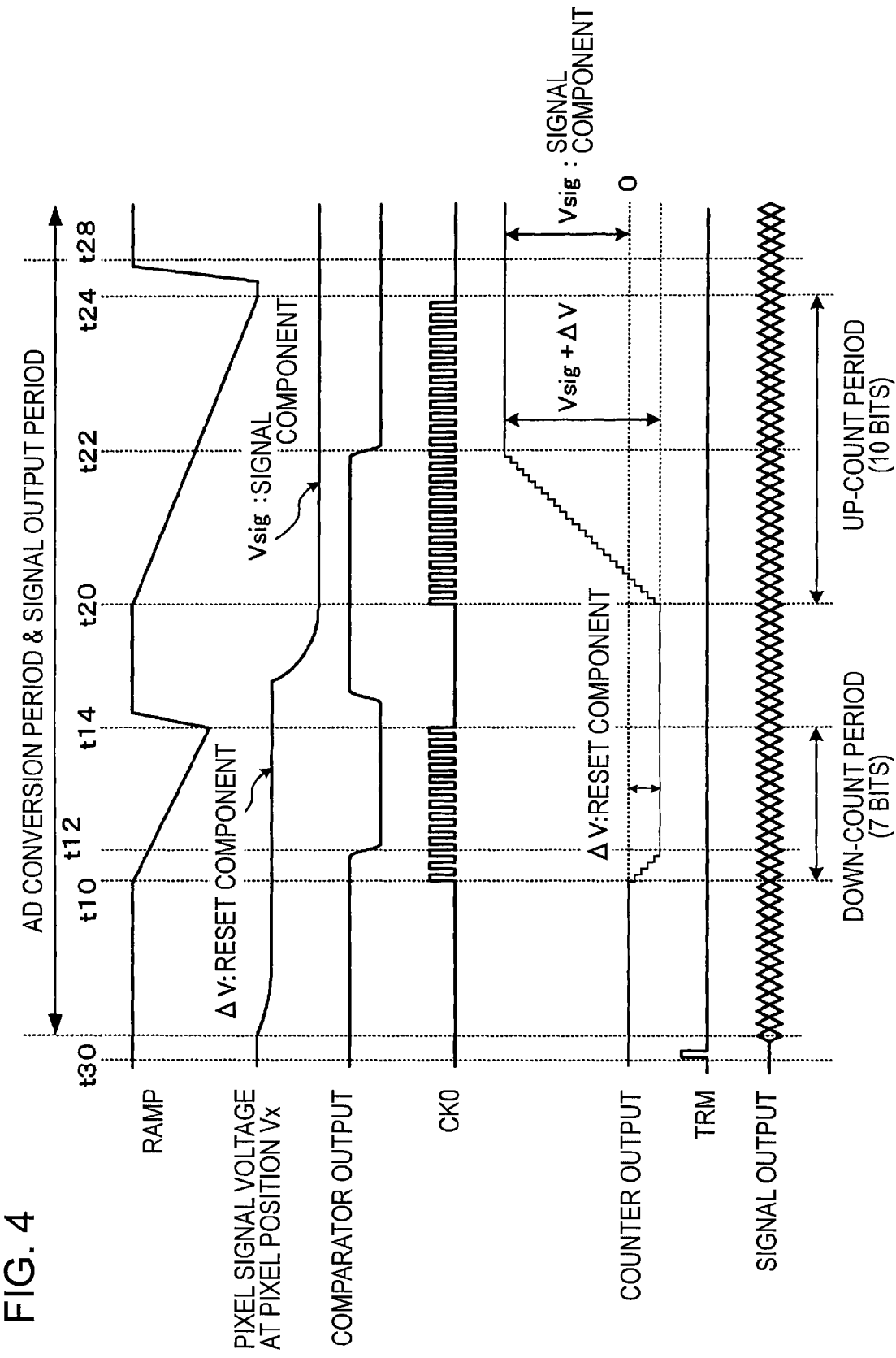
FIG. 4 is a timing chart for illustrating an operation of a column A/D circuit of the solid-state imaging device according to the second embodiment shown in FIG. 3.

FIG. 4 is a timing chart for illustrating an operation of the column A/D circuits 25 in the solid-state imaging device 1 according to the second embodiment shown in FIG. 3. The A/D conversion operation of the column A/D circuit 25 is similar to that of the column A/D circuit 25 according to the first embodiment, and a detailed description thereof is thus omitted.

In the second embodiment, the data storage unit 256 is added to the arrangement in the first embodiment. The basic operation of the second embodiment, such as A/D conversion, is similar to that in the first embodiment, except that, prior to the operation of the counter 254 (at time t30), the count values for a previous row Hx-1 are transferred to the data storage units 256 in response to a memory-transfer instruction pulse CN8 from the communication and timing controller 20.

The first embodiment imposes limitations on the reading operations because pixel data is not allowed to be output from the column processor 26 until the completion of the second reading operation, i.e., the completion of the A/D conversion operation. The second embodiment, however, imposes no limitations on the reading operations because the count values as a result of the previous subtraction have been transferred to the data storage units 256 prior to the first reading operation (A/D conversion operation).

Thus, the operation to output signals to the outside from the data storage units 256 via the horizontal signal lines 18 and the output circuit 28 is performed concurrently with the reading operation for the current row Hx and the counting operation of the counters 254, leading to more efficient signal output processing.

Third Embodiment

Figure 5:
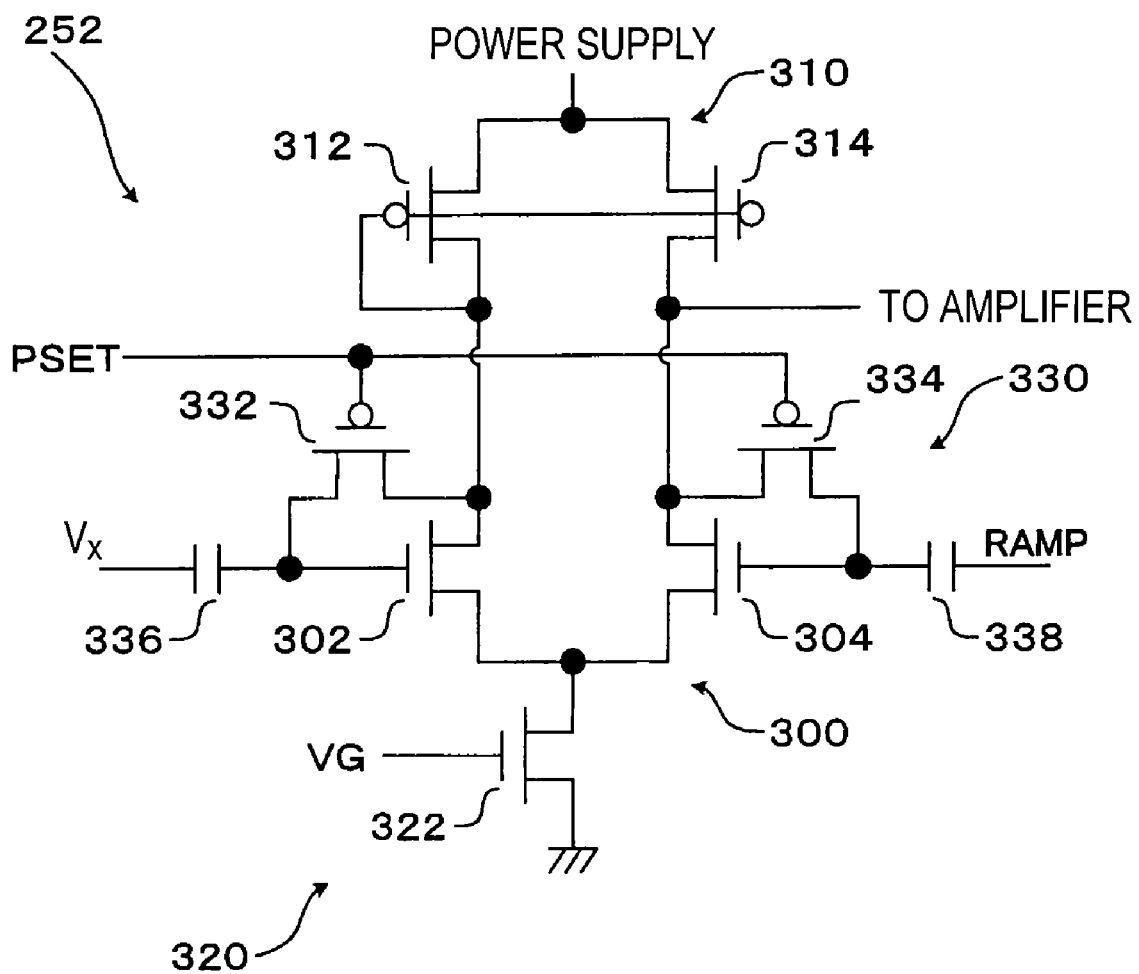
FIG. 5 is a schematic circuit diagram of a voltage comparator used in a CMOS solid-state imaging device (CMOS image sensor) according to a third embodiment of the present invention.

FIG. 5 is a schematic circuit diagram of a voltage comparator 252 used in a CMOS solid-state imaging device (CMOS image sensor) 1 according to a third embodiment of the present invention. In the solid-state imaging device 1 according to the third embodiment, the voltage comparator 252 in the solid-state imaging device 1 according to the first embodiment is modified so that the comparison period can be set irrespective of variations in the reset component ΔV. The details will now be described.

The voltage comparator 252 shown in FIG. 5 has a known differential amplifier configuration, as in the comparator disclosed in the fifth non-patent document noted above (see FIG. 8). The voltage comparator 252 includes a differential transistor pair 300 having NMOS transistors 302 and 304, a load transistor pair 310 having a p-channel MOS (PMOS) transistors 312 and 314, and a current source 320 having an NMOS constant-current source transistor 322. The load transistor pair 310 acts as an output load of the differential transistor pair 300, and is placed near a power supply. The current source 320 is placed near a ground (GND), and supplies a constant operating current to the transistor pairs 300 and 310.

Sources of the transistors 302 and 304 are commonly connected to a drain of the constant-current source transistor 322, and drains (output terminals) of the transistors 302 and 304 are connected to drains of the transistors 312 and 314 of the load transistor pair 310, respectively. A DC gate voltage VG is fed to a gate of the constant-current source transistor 322.

The output of the differential transistor pair 300 (in FIG. 5, the drain of the transistor 304) is connected to an amplifier (not shown) for amplification, and is then output via a buffer (not shown) to the counter 254.

The voltage comparator 252 according to the third embodiment further includes an operating-point resetter 330 that resets an operating point of the voltage comparator 252. The operating-point resetter 330 includes switching transistors 332 and 334, and signal-coupling capacitors 336 and 338.

The switching transistor 332 is connected between the gate (input terminal) and drain (output terminal) of the transistor 302, and the switching transistor 334 is connected between the gate (input terminal) and drain (output terminal) of the transistor 304. A comparator reset signal PSET is commonly supplied to the gates of the transistors 302 and 304.

A pixel signal Vx is supplied to the gate (input terminal) of the transistor 302 via the capacitor 336, and a reference voltage RAMP is supplied to the gate (input terminal) of the transistor 304 from the reference signal generator 27 (not shown).

The operating-point resetter 330 achieves a sample-and-hold function with respect to the signals input via the capacitors 336 and 338. The operating-point resetter 330 sets the comparator reset signal PSET to active (in this embodiment, a high level) only prior to the start of comparison between the pixel signal Vx and the reference voltage RAMP, and resets the operating point of the differential transistor pair 300 to a drain voltage (read potential, which is an operational reference value for reading a reference component or a signal component). Then, the pixel signal Vx is fed to the transistor 302 via the capacitor 336, and the reference voltage RAMP is fed via the capacitor 338. The pixel signal Vx and the reference voltage RAMP are compared until both potentials become equal. When the pixel signal Vx and the reference voltage RAMP have the same potential, the output of the voltage comparator 252 is inverted.

The comparator reset signal PSET is supplied so that the gates and drains of the transistors 302 and 304 of the differential transistor pair 300 are temporarily connected (short-circuited) for diode-connection. After the sum of an input of the amplifier transistor in the unit pixel 3 and an offset component of the transistor 304 is stored in the input terminal (gate) of the transistor 304, the reference voltage RAMP is input, thereby starting the comparison between the pixel signal Vx and the reference voltage RAMP. The operating point of the voltage comparator 252 is set based on the read potential of the pixel signal Vx, leading to less susceptibility to variations in the reset component ΔV.

Figure 6:
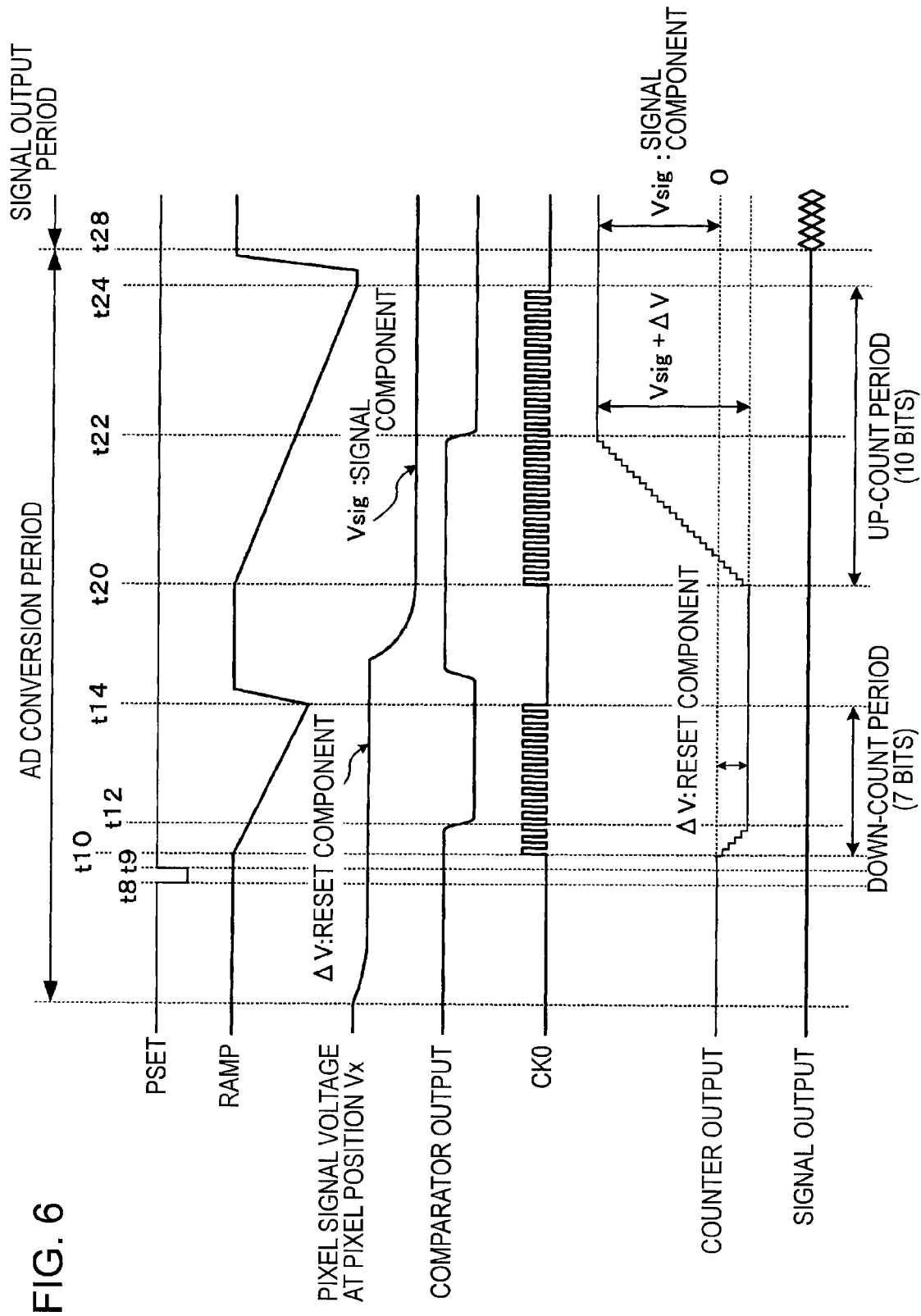
FIG. 6 is a timing chart for illustrating an operation of a column A/D circuit of the solid-state imaging device according to the third embodiment.

FIG. 6 is a timing chart for illustrating an operation of column A/D circuits 25 in the solid-state imaging device 1 according to the third embodiment. The operation shown in FIG. 6 is a modification of the operation in the first embodiment.

A/D conversion in the column A/D circuits 25 according to the third embodiment is basically similar to that according to the first embodiment, except for the operation of the operating-point resetter 330. The operation of the operating-point resetter 330 according to the third embodiment will mainly be discussed.

For the first reading operation, the communication and timing controller 20 resets the count value of the counter 254 to an initial value of 0, and sets the counter 254 to the down-count mode. After the first reading operation of reading pixel signals from the unit pixels 3 of an arbitrary row Hx to the vertical signal lines 19 (H0, H1, ...) becomes stable, the communication and timing controller 20 sets the comparator reset signal PSET to active (or a high level), and resets the voltage comparator 252 (for a period from t8 to t9). Then, the communication and timing controller 20 supplies the control data CN4 for generating the reference voltage RAMP to the reference signal generator 27. In response to the control data CN4, the voltage comparator 252 starts comparison between the RAMP-waveform comparative voltage and the pixel signal voltage on the arbitrary vertical signal line 19 (Vx) supplied from the pixel unit 10.

As in the first embodiment, in the first reading operation, counting is performed with respect to the reset level Vrst of the pixel signal voltage Vx that is detected by the voltage comparator 252. In the first reading operation, therefore, the reset component ΔV of the unit pixel 3 is read.

The reset component ΔV includes noise that varies depending on the unit pixel 3 as an offset. The variations in the reset component ΔV are generally small, and the reset level Vrst is substantially common to all pixels. Thus, the output of the reset component ΔV in the pixel signal voltage Vx of an arbitrary vertical signal line 19 is substantially known.

In the third embodiment, when the voltage comparator 252 is reset in response to the comparator reset signal PSET, the reset component ΔV is prevented from being out of a comparable range irrespective of variations in the reset component ΔV even when the gain increases because the operating point of the voltage comparator 252 is set based on the read potential in the first reading operation.

Thus, in the first reading operation of reading the reset component ΔV, by adjusting the RAMP voltage, the down-count period (the comparison period from t10 to t14) can be reduced more than the first embodiment.

In the second reading operation, a signal component Vsig corresponding to the amount of light incident on each of the unit pixels 3 is read in addition to the reset component ΔV, and a similar operation to that of the first reading operation is performed. It is noted that the comparator reset signal PSET is still turned off so that the voltage comparator 252 is not reset in response to the comparator reset signal PSET.

Subtraction is performed by the counter 254 using the two reading and counting operations, i.e., down-counting in the first reading operation and up-counting in the second reading operation, thereby removing the reset component ΔV including variations for each of the unit pixels 3 and the offset component for each of the column A/D circuits 25. Only the signal component Vsig corresponding to the amount of light incident on each of the unit pixels 3 can be extracted with a simple arrangement. Advantageously, reset noise can also be removed.

The operating-point resetter 330 having the sample-and-hold function that is additionally provided in the voltage comparator 252 can lead to concern for kTC noise. Since the second signal reading operation is performed while turning off the comparator reset signal PSET, the subtraction performed by the counter 254 allows the kTC noise caused by the sampling-and-holding of the comparator reset signal PSET in the first reading operation to be removed. Therefore, only the signal component Vsig corresponding to the amount of light incident on each of the unit pixels 3 can be extracted without the influence of the kTC noise.

According to the third embodiment, the counter 254 processes results of the first and second reading operations while switching the count mode of the counter 254, thereby performing direct subtraction on a column-by-column basis. During the subtraction, the counter 254 stores a result of the first reading operation and reads a result of the second reading operation. Therefore, advantageously, the fixed offset noise, as well as the kTC noise caused by the sampling-and-holding, can be removed.

In order to overcome only the problem in that it can be difficult to perform comparison because the reset component ΔV is out of a comparable range due to variations in the reset component ΔV, it may suffice that the comparator reset signal PSET is turned on for both the first and second operations by the operating-point resetter 330 with the sample-and-hold function before performing comparison. It is not necessarily required that the second signal reading operation is performed while turning off comparator reset signal PSET. In this case, however, it is difficult to remove the kTC noise caused by the sampling-and-holding.

Figure 7:
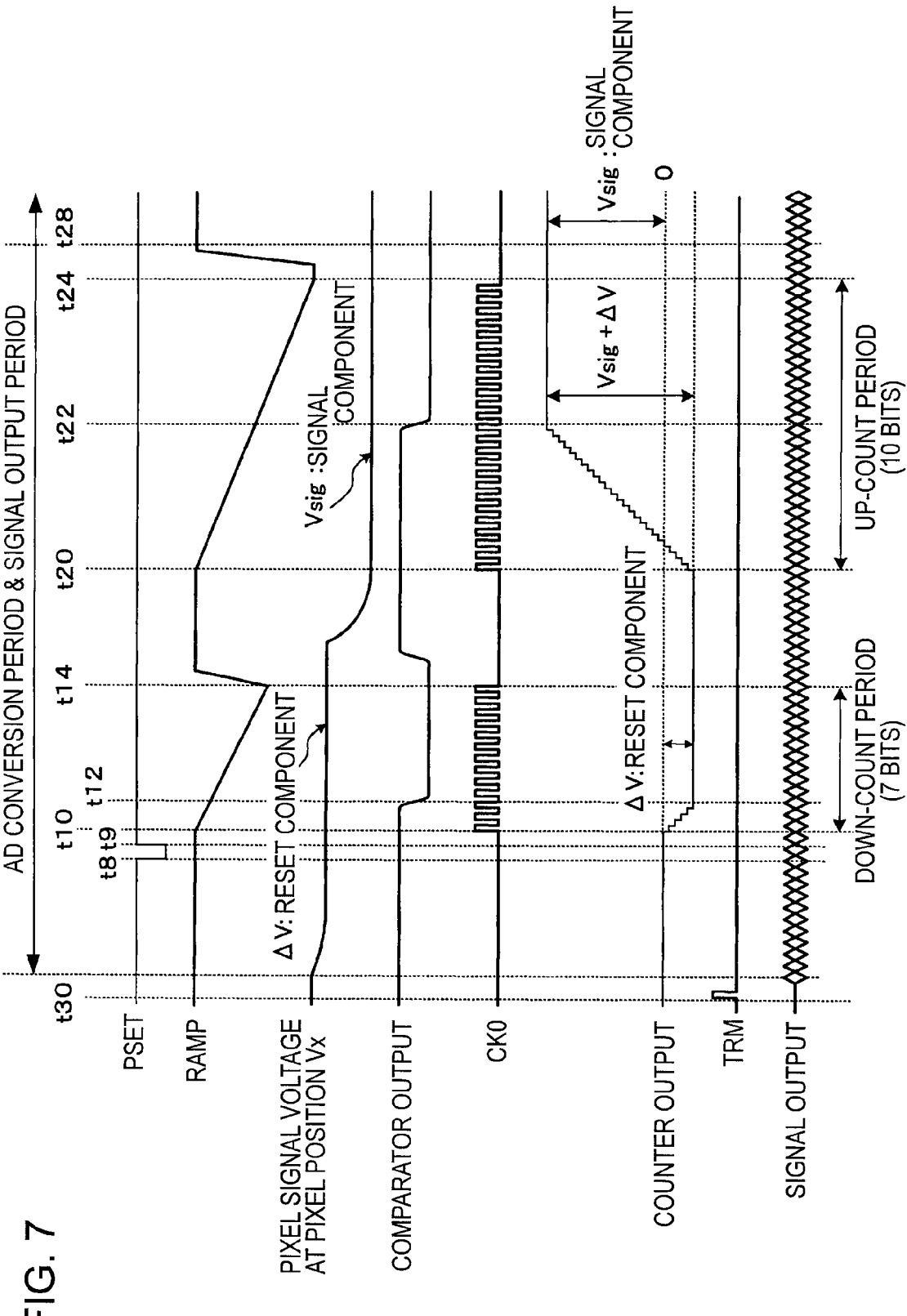
FIG. 7 is a timing chart for illustrating an operation of a column A/D circuit of a solid-state imaging device according to a fourth embodiment of the present invention.

FIG. 7 is a timing chart for illustrating an operation of column A/D circuits 25 in a solid-state imaging device 1 according to a fourth embodiment of the present invention. In the solid-state imaging device 1 according to the fourth embodiment, as in the third embodiment, the voltage comparator 252 in the solid-state imaging device 1 according to the second embodiment is modified so that the comparison period can be set irrespective of variations in the reset component ΔV A/D conversion in the column A/D circuits 25 according to the fourth embodiment is basically similar to that according to the second embodiment, except for the operation of the operating-point resetter 330.

After the first reading operation of reading pixel signals from the unit pixels 3 of an arbitrary row Hx to the vertical signal lines 19 (H0, H1, . . . ) becomes stable, the communication and timing controller 20 sets the comparator reset signal PSET to active (or a high level), and resets the voltage comparator 252 (for a period from t8 to t9). Then, the communication and timing controller 20 supplies the control data CN4 for generating the reference voltage RAMP to the reference signal generator 27. In the second reading operation, the comparator reset signal PSET is still turned off so that the voltage comparator 252 is not reset in response to the comparator reset signal PSET.

The operation of the operating-point resetter 330 according to the fourth embodiment is similar to that in the third embodiment. As in the third embodiment, the reset component ΔV is prevented from being out of a comparable range irrespective of variations in the reset component ΔV even when the gain increases. Furthermore, only the signal component Vsig corresponding to the amount of light incident on each of the unit pixels 3 can be extracted without the influence of kTC noise.

While some embodiments of the present invention have been described, the technical scope of the present invention is not limited to the scope disclosed in the foregoing embodiments. A variety of modifications and improvements may be made to the foregoing embodiments without departing from the scope of the invention, and such modifications and improvements may also fall within the technical scope of the present invention.

It is to be noted that the foregoing embodiments are not intended to limit the scope of the invention. It is also to be noted that all combinations of the features described in connection with the above-described embodiments are not necessarily required. The foregoing embodiments include various aspects of the present invention. Appropriate combinations of a plurality of elements disclosed in the embodiments realize various aspects of the present invention. Even a structure without some of the elements disclosed in the embodiments can constitute an embodiment of the present invention as far as an advantage of the invention is achieved.

For example, in the foregoing embodiments, the column A/D circuits 25 each including the voltage comparator 252 and the counter 254 are provided for the respective columns, and digital data is generated for each column. Alternatively, a single column A/D circuit 25 may be provided for a plurality of columns by providing a switching circuit for switching the columns.

In the foregoing embodiments, furthermore, an A/D conversion function unit is located in a column region on the output side of the pixel unit 10. The A/D conversion function unit may be located in any other region. For example, analog pixel signals may be output to the horizontal signal lines 18, and the digital data into which the analog pixel signals are converted may be transferred to the output circuit 28.

Also in this case, a reference signal for A/D conversion is compared with a signal to be processed including a reference component and a signal component. Concurrently with this comparison, counting is performed in one of the down-count mode and the up-count mode. When a count value at a time of completion of the comparison is stored, the count mode is switched depending on whether the comparison is performed on the reference component or the signal component. Thus, digital data representing the difference between the reference component and the signal component can be obtained as a result of two counting operations in the down-count mode and the up-count mode.

Therefore, memories for storing a count value for the reference component and a count value for the signal component can be implemented by the latch function of the counter, and no dedicated memory for storing A/D converted data is needed separately from the counter. A single A/D conversion function unit may be sufficient for all columns. Although high-speed conversion performance is needed, the circuit size is reduced over the foregoing embodiments.

In the foregoing embodiments, the second counting operation is started from the count value stored in the first counting operation. With the use of a synchronous up-down counter that outputs a count value in synchronization with the count clock CK0, no particular operation is needed for switching the mode.

However, when an asynchronous up-down counter suitable for a high-speed operation because its operation limit frequency is determined only by the limit frequency of the first flip-flop (basic element of the counter) is used, the count value is broken when the count mode is switched, thereby preventing counting from being normally performed while maintaining the count value before and after the switching. Preferably, an adjuster that allows the second counting operation to be started from a count value stored in the first counting operation is provided. The adjuster is not discussed in detail herein.

In the foregoing embodiments, a signal component Vsig temporally appears after a reset component ΔV (reference component) in a pixel signal of the same pixel, and a processor placed downstream processes a signal of the positive polarity (the higher the signal level, the larger the positive value). Comparison and down-counting are performed on the reset component ΔV (reference component) in the first process, and comparison operation and up-counting are performed on the signal component Vsig in the second process. However, any combination of the component to be processed and the count mode and any processing order may be used irrespective of the sequential order of appearance of the reference component and the signal component. Depending on the processing order, digital data obtained in the second process may have a negative value. In such a case, a correction may be performed or other suitable measure may be taken.

In a device architecture of the pixel unit 10 in which the reset component ΔV (reference component) needs to be read after the signal component Vsig and a processor placed downstream processes a signal of the positive polarity, it is efficient to perform comparison and down-counting on the signal component Vsig in the first process and to perform comparison and up-counting on the reset component ΔV (reference component) in the second process.

In the foregoing embodiments, the up-down counter is commonly used irrespective of the operation mode and performs counting while switching the count mode of the up-down counter. Any arrangement capable of performing counting on the reference component and the signal component by using a combination of the down-count mode and the up-count mode, other than the arrangement using a mode-switchable up-down counter, may be used.

For example, the counter may be implemented by a combination of a down-counter circuit that performs down-counting after performing comparison on one of the reference component and the signal component and an up-counter circuit that performs up-counting after performing comparison on the other one of the reference component and the signal component.

Figure 8A:
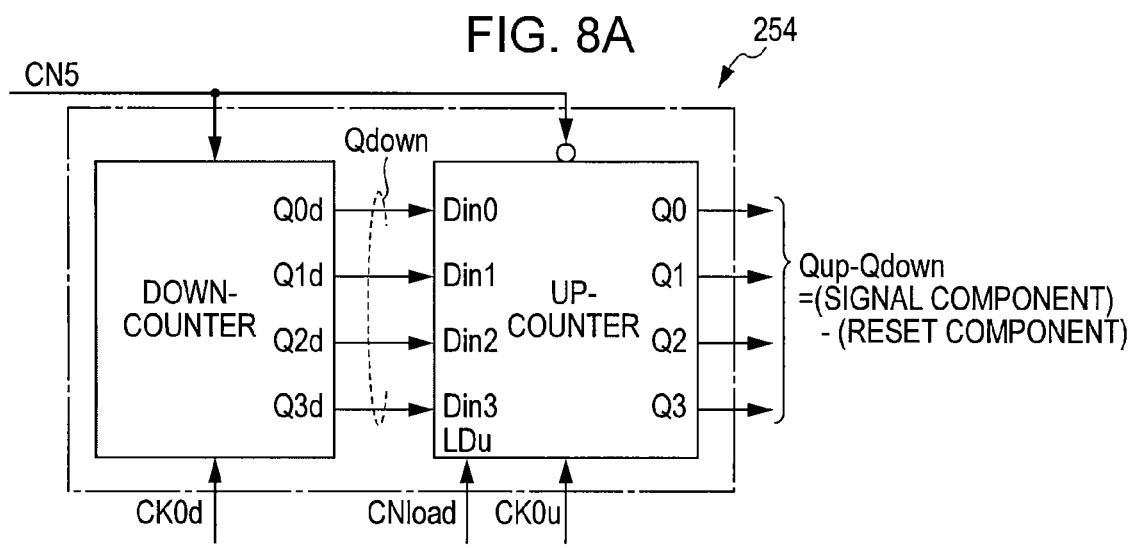
FIGS. 8A to 8C are circuit block diagrams illustrating modifications of a counter.

In such a case, the counter circuit that performs the second counting operation is designed so that an arbitrary initial value can be loaded using a known technique. For example, in a case of performing down-counting, followed by up-counting, as shown in FIG. 8A, a down-counter is activated in the first counting process and an up-counter is activated in the second counting process.

Prior to the start of up-counting after switching the count mode in response to a switching control signal CN5 for switching the count mode, a switching control signal CNload for setting an initial value is supplied to a load terminal LDu of the up-counter so that a down-count value obtained by down-counting is set to the up-counter as the initial value.

Figure 8B:
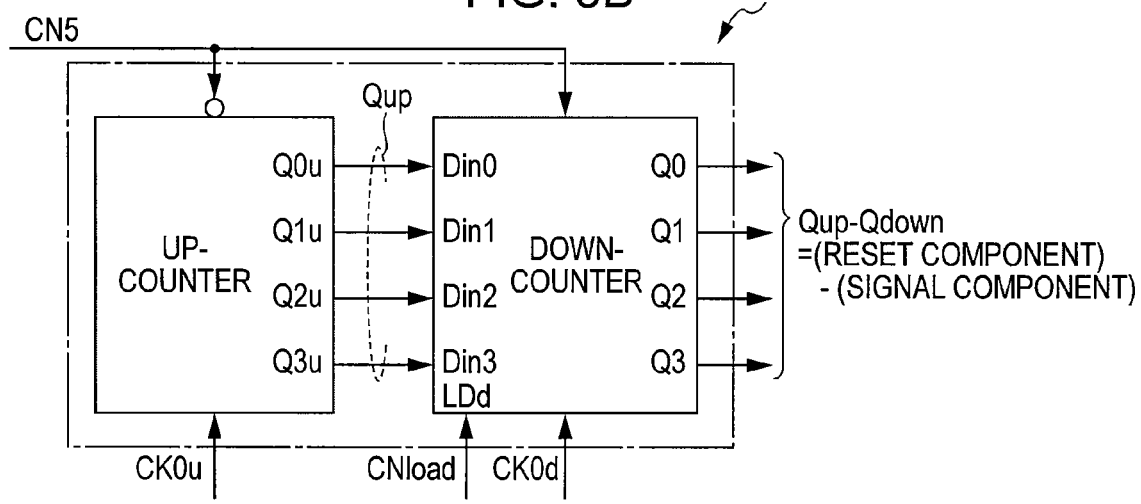

In a case of performing up-counting, followed by down-counting, as shown in FIG. 8B, an up-counter is activated in the first counting process and a down-counter circuit is enabled in the second counting process.

Prior to the start of down-counting after switching the count mode in response to a switching control signal CN5 for switching the count mode, a switching control signal CNload for setting an initial value is supplied to a load terminal LDd of the down-counter so that an up-count value obtained by up-counting is set to the down-counter as the initial value.

In any of the arrangements shown in FIGS. 8A and 8B, with respect to the output of the downstream counter, it is possible to directly subtract a reference component from a signal component, and no special adder is needed to calculate the difference between the reference component and the signal component. Furthermore, there is no need for data transfer to a subtractor, which is needed in the first non-patent document noted above. This serves to avoid increase in noise, current, or power consumption due to such data transfer.

Figure 8C:
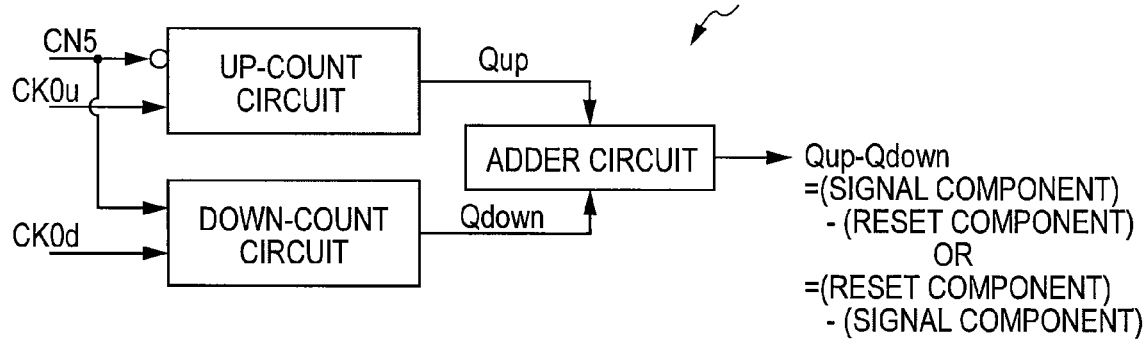

In a case where the counter is implemented by a combination of a down-counter circuit and an up-counter circuit, in the second counting operation, instead of setting a count value obtained in the first counting operation as an initial value, counting may be started from zero. In this case, as shown in FIG. 8C, an adder circuit for calculating a sum of an output Qup of the up-counter circuit and an output Qdown of the down-counter circuit is needed. Even in this case, the adder circuit is provided for each A/D converter including a comparator and a counter, and the line length can be reduced. This serves to avoid increase in noise, current, or power consumption due to such data transfer.

In any of the arrangements shown in FIGS. 8A to 8C, the communication and timing controller 20 may issue an activation instruction to the down-counter circuit and the up-counter circuit, as in the foregoing embodiments. The down-counter circuit and the up-counter circuit may be activated in response to the count clock CK0.

In the third and fourth embodiments, the basic configuration of the voltage comparator 252 is similar to the configuration of the comparator shown in FIG. 8 in the fifth non-patent document noted above. However, any other voltage comparator may be used in the arrangement according to the third and fourth embodiments in which in a case of performing comparison and counting on the reference component, the comparator is first reset to a predetermined operational reference value after which a reference signal is supplied to the comparator, to thereby start comparison and counting.

For example, the pixel-signal input section of the differential transistor pair 300 may be DC-connected to the pixel signal generators of the unit pixels 3. The input and output of the transistor to which the reference voltage RAMP is fed may temporarily be short-circuited, and the input terminal may be reset to a predetermined operational reference value.

While the foregoing embodiments have been described in the context of a sensor including unit pixels constructed of NMOS transistors, a sensor including unit pixels constructed of PMOS transistors may also achieve similar advantages to those in the foregoing embodiment by taking the potential relationship into consideration such that the polarities of potential are reversed.

In the foregoing embodiments, a CMOS sensor including a pixel unit that generates signal charges in response to received light is used as an exemplary solid-state imaging device capable of selectively reading signals from individual unit pixels by address control. Signal charges may be generated in response to not only light but also any other electromagnetic radiation, such as infrared rays, ultraviolet rays, or x-rays. The features of the foregoing embodiments can be applied to a semiconductor device including multiple-element unit elements that output analog signals corresponding to the amount of electromagnetic radiation received.

In the foregoing embodiments, the solid-state imaging device includes an A/D converter (in the foregoing embodiments, column A/D circuits) including a comparator and a counter. The comparator compares a signal corresponding to each of a reference component and a signal component with a reference signal for A/D conversion. Concurrently with the comparison in the comparator, the counter performs counting in one of the down-count mode and the up-count mode, and stores a count value at a time of completion of the comparison in the comparator. However, the arrangement for A/D conversion according to the foregoing embodiments is not limited to a solid-state imaging device, and may be applied to any electronic apparatus using an A/D converter for converting a difference signal component between two signal components into digital data.

The A/D converter described in relation to the foregoing embodiments is not necessarily incorporated in a solid-state imaging device or any other electronic apparatus. For example, the A/D converter may be provided as an independent device in the form of an integrated circuit (IC) or an A/D converting module.

In this case, the A/D converter may include a comparator and a counter. Alternatively, the A/D converter may be incorporated in an IC or a module including a combination of separate chips. In the IC, a reference signal generator that generates a reference signal for A/D conversion and that supplies the reference signal to the comparator and a controller that switches the count mode of the counter depending on whether the comparator performs comparison on the reference component or the signal component may be mounted on the same semiconductor substrate thereof.

Accordingly, functional units needed to control the operation of the comparator and the counter can integrally be handled, leading to easy handling and management of parts. Since elements needed for A/D conversion are incorporated (or integrated) in the form of an IC or a module, a solid-state imaging device and an electronic apparatus can easily be manufactured as a finished product.

It should be understood by those skilled in the art that various modifications, combinations, sub-combinations and alterations may occur depending on design requirements and other factors insofar as they are within the scope of the appended claims or the equivalents thereof.

The invention claimed is:

1. A driving method of a complementary-metal-oxide-semiconductor (CMOS) image sensor comprising:
   resetting an operating-point of a comparator before comparing operation;
   comparing a signal sent from an imaging area with a reference signal sent from a reference signal generating portion; and
   performing a counting operation in parallel with comparing the signal sent from the imaging area with the reference signal,
   wherein,
   the operating-point of the comparator is reset after readout operation of the signal from a pixel in the imaging area onto a signal line which leads to the comparator becoming stable.

2. The driving method of a complementary-metal-oxide-semiconductor (CMOS) image sensor comprising:
   resetting an operating-point of a comparator before comparing operation;
   comparing a reset signal sent from an imaging area with a reference signal sent from a reference signal generating portion;
   performing a first counting operation in one of a down-count mode and an up-count mode in parallel with comparing the reset signal with the reference signal;
   comparing an image signal sent from the imaging area with a reference signal sent from the reference signal generating portion; and
   performing a second counting operation in the other of the down-count mode and the up-count mode in parallel with comparing the image signal with the reference signal,
   wherein,
   the operating-point of the comparator is reset after readout operation of the signal from a pixel in the imaging area on to a signal line which leads to the comparator becoming stable.

3. The driving method of a CMOS image sensor according to claim 2, wherein the operating-point of the comparator can be reset before comparing the reset signal sent from an imaging area with the reference signal sent from the reference signal generating portion.

4. The driving method of a CMOS image sensor according to claim 2, wherein the first counting operation is performed after the second counting operation is completed.

5. A complementary-metal-oxide-semiconductor (CMOS) image sensor comprising:
   a comparator part configured to compare a signal sent from an imaging area with a reference signal sent from a reference signal generating portion;
   a counter part configured to count selectively in one of a down-count mode and an up-count mode in parallel with a comparing operation said comparator part performs; and
   a reset signal line configured to reset an operating-point of a comparator in said comparator part,
   wherein
   the comparator in said comparator part compares a reset signal sent from the imaging area with a reference signal sent from a reference signal generating portion;
   a counter in said counter part performs a first counting operation in one of the down-count mode and the up-count mode in parallel with said comparator comparing the reset signal with the reference signal;
   the comparator in said comparator part compares an image signal sent from the imaging area with a reference signal sent from the reference signal generating portion; and
   the counter in said counter part performs a second counting operation in the other of the down-count mode and the up-count mode in parallel with said comparator comparing the image signal with the reference signal.

6. The CMOS image sensor according to claim 5, wherein said comparator part includes a plurality of comparators each of which is allocated to a plurality of pixel columns of the imaging area.

7. A module comprising:
   an A/D conversion part including a comparator part configured to compare a signal sent from an imaging area with a reference signal sent from a reference signal generating portion and a counter part configured to count selectively in one of a down-count mode and an up-count mode in parallel with a comparing operation said comparator part performs; and
   a reset signal line configured to reset an operating-point of a comparator in the comparator part,
   wherein
   the comparator in the comparator part compares a signal sent from the imaging area with a reference signal sent from the reference signal generating portion, a counter in the counter part performs a counting operation in one of the down-count mode and the up-count mode in parallel with the comparator comparing the signal with the reference signal, and the operating-point of the comparator is reset after readout operation of the signal from a pixel in the imaging area onto a signal line which leads to the comparator becoming stable.

8. An electronic apparatus comprising:

a complementary-metal-oxide-semiconductor (CMOS) image sensor having an imaging area including a plurality of pixels;

a comparator part configured to compare a signal sent from the imaging area with a reference signal sent from a reference signal generating portion;

counter part configured to count selectively in one of a down-count mode and an up-count mode in parallel with a comparing operation the comparator part performs; and a reset signal line configured to reset an operating-point of a comparator in the comparator part, wherein the comparator in the comparator part compares a signal sent from the imaging area with a reference signal sent from the reference signal generating portion, a counter in the counter part performs a counting operation in one of the down-count mode and the up-count mode in parallel with the comparator comparing the signal with the reference signal, and the operating-point of the comparator is reset after readout operation of the signal from a pixel in the imaging area onto a signal line which leads to the comparator becoming stable.

* * * * *